United States Patent [19]

Nagano

[11] Patent Number: 4,819,241
[45] Date of Patent: Apr. 4, 1989

[54] LASER DIODE DRIVING CIRCUIT

[75] Inventor: Katsumi Nagano, Tokyo, Japan

[73] Assignee: Kabushiki Kaisha Toshiba, Kawasaki, Japan

[21] Appl. No.: 897,051

[22] Filed: Aug. 15, 1986

[30] Foreign Application Priority Data

| Aug. 16, 1985 | [JP] | Japan | 60-179255 |
| Aug. 23, 1985 | [JP] | Japan | 60-184041 |
| Aug. 23, 1985 | [JP] | Japan | 60-184042 |
| Sep. 18, 1985 | [JP] | Japan | 60-204417 |
| Oct. 29, 1985 | [JP] | Japan | 60-240411 |

[51] Int. Cl.$^4$ .............................................. H01S 3/00
[52] U.S. Cl. ...................................... 372/38; 372/26; 372/29; 372/33; 372/32; 307/311
[58] Field of Search ............. 372/38, 32, 29, 26, 372/34, 33; 307/311

[56] References Cited

U.S. PATENT DOCUMENTS

| 3,898,583 | 8/1975 | Shuey | 372/38 |
| 4,009,385 | 2/1977 | Sell | 372/38 |

FOREIGN PATENT DOCUMENTS

| 0024991 | 3/1981 | Japan | 372/38 |
| 0162479 | 10/1982 | Japan | 372/38 |
| 0061691 | 4/1983 | Japan | 372/38 |

Primary Examiner—William L. Sikes
Assistant Examiner—Georgia Y. Epps
Attorney, Agent, or Firm—Foley & Lardner, Schwartz, Jeffery, Schwaab, Mack, Blumenthal & Evans

[57] ABSTRACT

The laser diode driving circuit comprises (a) a forward current circuit for driving the laser diode for generating a light output that corresponds to the forward current, (b) a photodiode for detecting current having a value corresponding to the level of the light output, (c) a reference current source connected on the output side of said photodiode and having a prescribed reference current value, (d) inverting and amplifying means for inverting and amplifying the difference current between the photovoltaic current from said photodiode and the reference current from said reference current source, and (e) a feedback circuit for feeding back the inverted and amplified output from said inverting and amplifying means to said forward current circuit, for controlling said forward current to a current value corresponding to the reference current.

62 Claims, 31 Drawing Sheets

FIG.8(A)　　FIG.8(B)
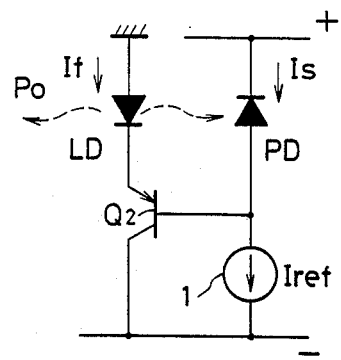
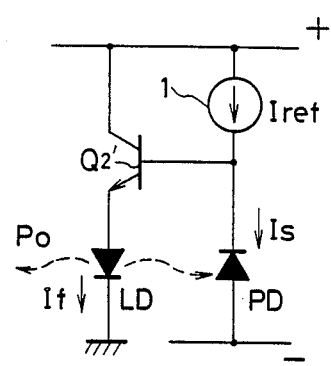
FIG.9(A)　　FIG.9(B)
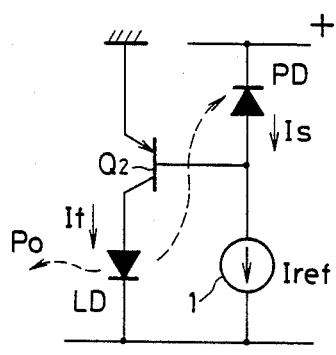
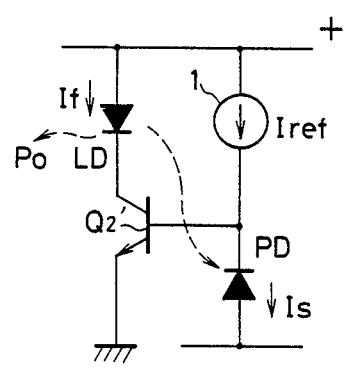

FIG.16(B)
FIG.16(A)
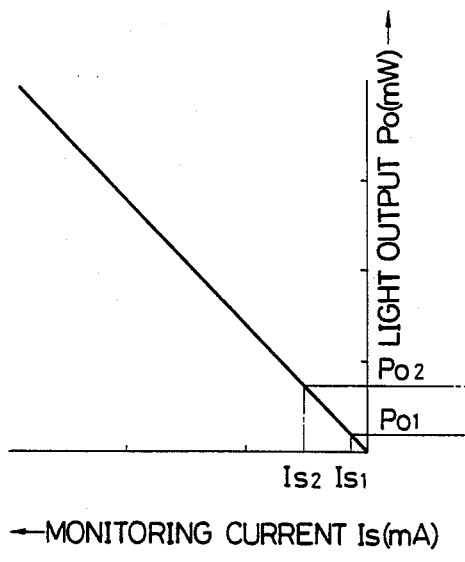
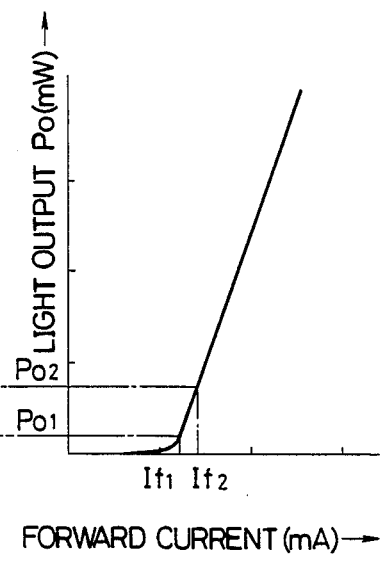

F I G. 31
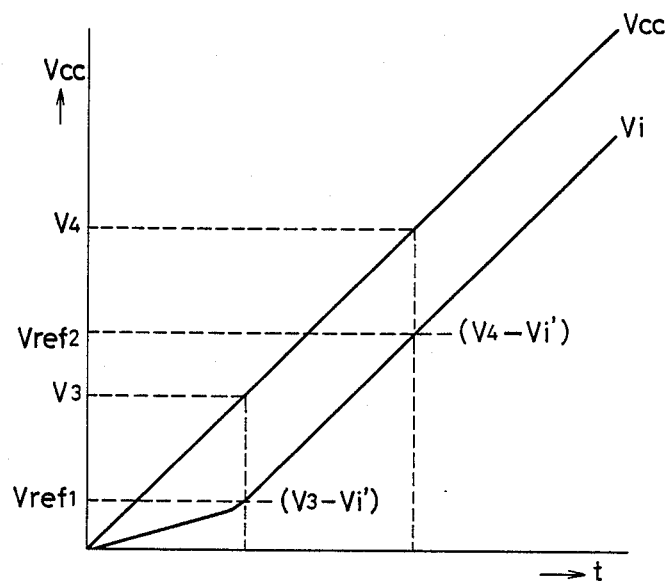

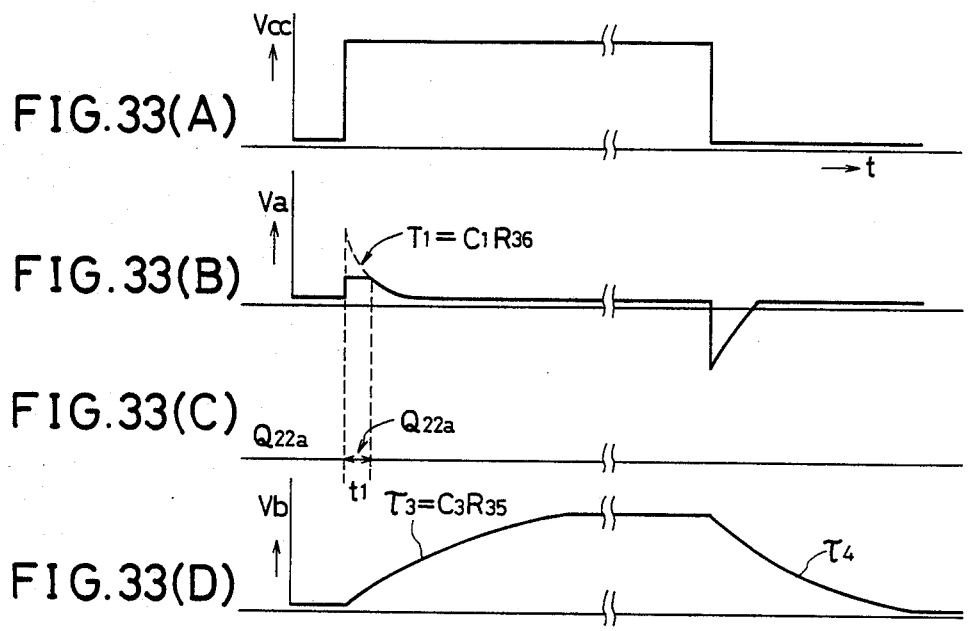

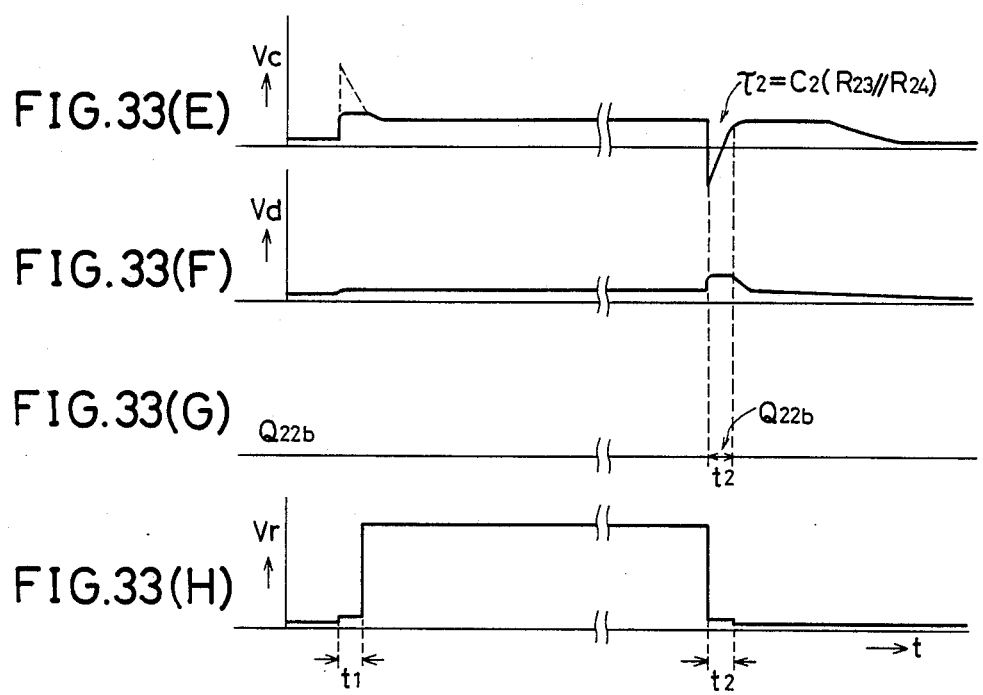

LASER DIODE DRIVING CIRCUIT

BACKGROUND OF THE INVENTION

1. Field of the Invention

The present invention relates to a laser diode driving circuit, more particularly to a laser diode driving circuit which controls a laser so as to generate a predetermined light output stably and quickly.

2. Description of the Prior Art

In optical information processors including optical disc devices, optical communications devices, and others, use is made of a laser diode as a light source. In using a laser diode as a light source in such a device, it is important to generate a light output from the laser diode fast and stably.

When the forward current reaches a predetermined threshold value, the laser diode starts to oscillate and outputs laser light. Thereafter, the light output increases in proportion to the forward current. However, the changes in the light output from the laser diode are relatively large compared to the changes in the forward current. For this reason, there have been proposed in the past driving circuits which can prevent variations in the light output of the laser diode and stably control the light output at a predetermined level. Such a circuit is called an automatic power control (APC) circuit. However, a prior driving circuit is uneconomical due to the relative complexity of the circuit configuration which requires, for example, three operational amplifiers. Moreover, its response to the variations in the light output is relatively slow, resulting in an unsatisfactory high speed control.

In addition, a laser diode has a relatively large forward voltage drop for a forward current so that it is accompanied by a considerable temperature rise, and like many of the semiconductor elements, it has a temperature dependence. Ordinarily, temperature rise is handled by the provision of a cooling means. However, when for some reason there flows an excess current that exceeds a rated value, temperature rise cannot be handled appropriately by means of a cooling means alone, leading to a concern of a breakdown of the laser diode. Further, in spite of the requirement that the laser diode be able to generate stably a prescribed light output even under changes in the temperature, there are few laser diodes that give sufficient consideration to the temperature compensation so as to control stably the light output of the laser diode for variations in the temperature, so that it becomes also necessary to have a sufficient measure for the temperature compensation.

SUMMARY OF THE INVENTION

An object of the present invention is to provide a laser diode driving circuit which controls stably and quickly the light output of a laser diode to a prescribed level by means of a relatively simple circuit configuration.

Another object of the present invention is to provide a laser diode driving circuit which can prevent the breakdown of the laser diode due to flow of an excess current in it, and control its stable operation.

Still another object of the present invention is to provide a laser diode driving circuit which is capable of variably modulating the level of light output precisely to each of a plurality of levels.

Still further object of the present invention is to provide a laser diode driving circuit which is capable of stably controlling the light output level of the laser diode to a prescribed value for variations in temperature.

A still further object of the present invention is to provide a laser diode driving circuit which is capable of controlling the laser diode to prevent its breakdown as a result of an abnormal operation caused by malfunctions due to drop in the supply voltage.

According to the present invention, light output of the laser diode is detected and converted to an electrical signal that corresponds to the level of light output, the electrical signal is compared with a reference signal and a control is given so that the electrical signal has a prescribed value that corresponds to the reference signal. Therefore, it is possible to control the light output of the laser diode stably at a prescribed value. Further, its circuit configuration is simple so that the response characteristics are extremely satisfactory, and the high speed controllability is excellent, making it possible to realize a high degree of economy.

Further, according to the present invention, the forward current in the laser diode is detected and the forward current is controlled when it exceeds a prescribed current value. Therefore, it is possible to prevent the breakdown of the laser diode due to excess current, and to realize a stable operation of the system.

Moreover, according to the present invention, a plurality of reference signals are generated, and the electrical signal that corresponds to the level of light output of the laser diode is controlled so as to be equal to the value that corresponds to a reference signal selected from among a plurality of reference signals. Therefore, it is possible to variably modulate the light output of the laser diode in a free fashion.

Furthermore, according to the present invention, there is provided a reference signal source which generates a reference signal with a signal level that has the opposite temperature, characteristics to the temperature coefficient of the light output level characteristics for the laser diode, the light output from the laser diode is converted to an electrical signal, and the electrical signal is compared with the reference signal to be controlled so as to have a value that corresponds to the reference signal. Therefore, it is possible to control the light output of the laser diode to a predetermined value, even when there are generated temperature changes in the laser diode.

Still further, according to the present invention, the power supply voltage is detected, and the operation of the laser diode is interrupted when the power supply voltage is at a predetermined value. Therefore, needless to mention the case of a drop in the power supply voltage for some reason, but also in the low voltage state which the power supply voltage has to go through in the closing or opening of the power supply, it is possible to prevent the breakdown of the laser diode that may be caused by the generation of an abnormally high light output due to abnormal operation of the laser diode.

BRIEF DESCRIPTION OF THE DRAWINGS

FIGS. 8A and 8B illustrate circuit diagrams for showing the important parts of a third modification to the first embodiment, FIG. 9A and 9B illustrate circuit diagrams for showing the important parts of a fourth modification to the first embodiment.

FIG. 31 is a characteristic diagram for showing the relation between the change in the power supply voltage and the change in the input voltage for the circuit of FIG. 30.

DETAILED DESCRIPTION OF PREFERRED EMBODIMENTS

Figure 1A:
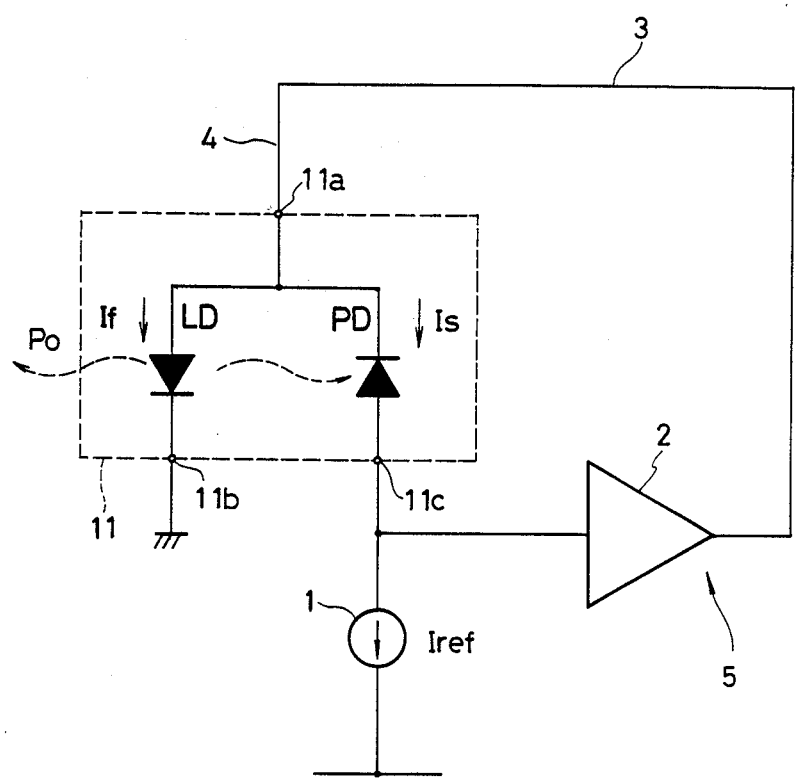
FIGS. 1 (a) and 1 (b) are circuit diagrams for a first embodiment of the laser diode driving circuit in accordance with the present invention.

Referring to FIG. 1(a), there is shown a first embodiment of the laser diode driving circuit according to the present invention. The laser diode driving circuit as, for example, a laser diode LD which is used as the light source for the optical disc device and a photodiode PD which converts the light output from the laser diode LD to an electrical signal. Here, the laser diode LD and the photodiode PD are built in a package 11. From the package 11 there are taken out to the outside a total of three terminal pins, namely, a common connecting terminal 11a which jointly connects the anode of the laser diode LD and the cathode of the photodiode PD, a cathode terminal 11b of the laser diode LD, and an anode terminal 11c of the photodiode PD. One of the output surfaces of the laser diode LD is placed facing the photodiode PD, and a light output $P_0$ is taken out from the other output surface to the outside.

The cathode terminal 11b of the laser diode LD is connected to the reference voltage (ground). To the anode terminal 11c are connected a reference current source 1 and a current controlling means 5 which controls the forward current that is supplied to the laser diode LD so as to bring the photovaltaic current $I_s$ in the photodiode PD that monitors the light output $P_0$ of the laser diode LD to be equal to the reference current $I_{ref}$ that flows in the reference current source 1. The current controlling means 5 comprises an inverting amplifier 2 which is connected to the anode terminal 11c of the photodiode PD and a feedback circuit 3 which feeds back the inverted and amplified output from the inverting amplifier 2 to the forward current circuit 4 that is connected to the common connecting terminal 11a, in order to invert and amplify the difference current between the photovoltaic current $I_s$ and the reference current $I_{ref}$ that flows in the reference current source 1.

Such a laser driving circuit can easily be integrated. Needless to say, however, under the current circumstances, it is preferred to have the laser diode and the photodiode as externally attachable parts. Accordingly, it is conceivable to integrate the part of FIG. 1(a) which excludes LD and PD that are enclosed in a broken line 11. Further, from the viewpoint of ease in adjusting, the reference current source $I_{ref}$ may be set as an external resistor for the IC.

Figure 1B:
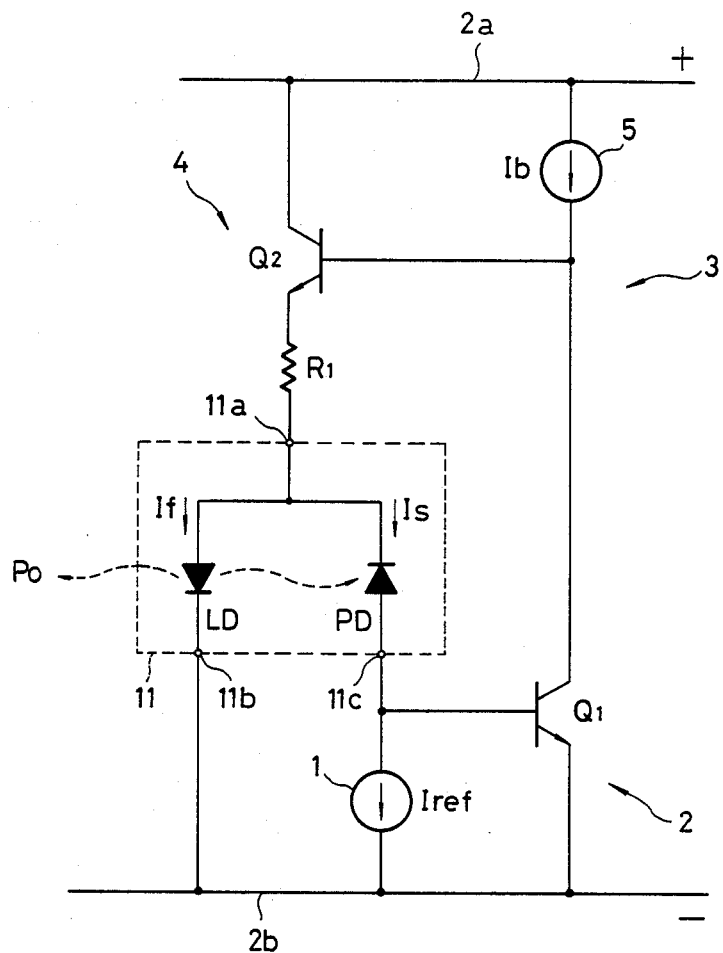

Referring to FIG. 1(b), there is shown a modification circuit of the first embodiment of a laser driving circuit according to the present invention. In this circuit, a common connecting terminal 11a is connected, from a positive power supply line 2a, to a forward current circuit 4 which has a driving transistor $Q_2$ and a resistor $R_1$ that regulates the forward current $I_f$ to a maximum rated value. Reference numeral 5 is a bias current circuit for the driving transistor $Q_2$, and serves also as the output circuit for the controlling transistor $Q_1$.

The controlling transistor $Q_1$ constitutes an inverting amplification means 2, and its base is connected to the anode terminal 11c of the photodiode PD, its emitter is connected to a power supply line 2b, and its collector is connected to the base of the driving transistor $Q_2$. The anode terminal 11c of the photodiode PD is connected via a reference current source 1 that supplies a reference current to the power supply line 2b. Further, the cathode of the laser diode LD is connected via the cathode terminal 11b to the power supply line 26.

Figure 2:
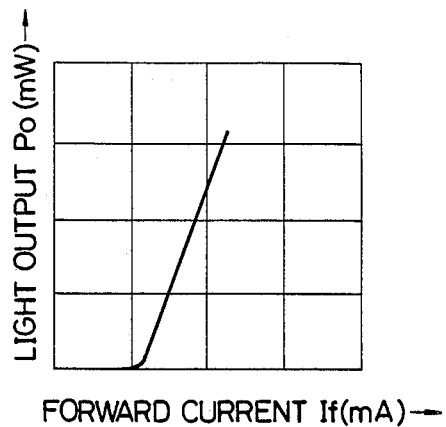
FIG. 2 is a characteristic diagram for showing the relation between the forward current and the light output for the laser diode used in the laser diode driving circuit shown in FIG. 1.
Figure 3:
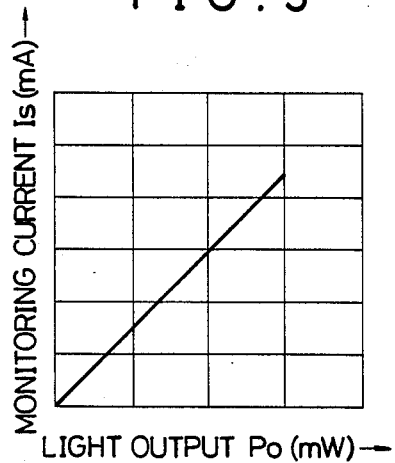
FIG. 3 is a characteristic diagram for showing the relation between the light output of the laser diode used in the laser diode driving circuit shown in FIG. 1 and the monitor current of the photodiode.

Next, referring to FIG. 2 and FIG. 3, the operation of the system will be described. FIG. 2 is a characteristic diagram for illustrating the relation between the forward current $I_f$ of the laser diode LD and the light output $P_0$, and FIG. 3 is a characteristic diagram for illustrating the relation between the light output $P_0$ of the laser diode LD and the monitoring current (photovoltaic current) $I_s$ that is generated in the photodiode PD.

From FIG. 2 it will be seen that there is obtained a light output $P_0$ by the oscillation of the laser diode LD when the forward current $I_f$ reaches a certain "threshold current", for instance 60 mA, and thereafter the light output $P_0$ increases in proportion to the forward current $I_f$. On the other hand, the photodiode PD generates a photovoltaic current $I_s$ upon receipt of the light output $P_0$. As shown in FIG. 3, the photovoltaic current $I_s$ increases in proportion to the light output $P_0$. A numerical example that shows the relation among the forward current $I_f$, the light output $P_0$, and the photovoltaic current $I_s$ at the room temperature is:

| Forward current $I_f$ | 90 mA |
|---|---|
| Light output $P_0$ | 10 mW |
| Photovoltaic current $I_s$ | 0.75 mA. |

From the above example, the proportionality factor of the photovoltaic current $I_s$ the light output $P_0$ is given by $$I_s/P_0 = 0.75 \text{ (mA)}/10 \text{ (mW)}. \quad (1)$$

Since the photovoltaic current $I_s$ of the photodiode PD is proportional to the light output $P_0$ as in the above, it becomes possible to control the light output $P_0$ at a constant value by detecting the photovoltaic current $I_s$ and feedback-controlling the light output $P_0$. In the present invention, the light output $P_0$ is arranged to have a constant value by controlling it so as to bring the detected photovoltaic current $I_s$ to be equal to the value that corresponds to the reference current $I_{ref}$.

Namely, in the state in which the relation between the photovoltaic current $I_s$ and the reference current $I_{ref}$ is $I_s < I_{ref}$, there flows no current to the base of the controlling transistor $Q_1$ so that the controlling transistor $Q_1$ is in an off-state. Then, the driving transistor $Q_2$ is brought to an on-state by the flow of a bias current $I_b$ from the bias current circuit 5, and as a result a maximum upper limit current flows in the laser diode LD. This current controlling resistor $R_1$ to increase the light output $P_0$.

When there is realized the relation $I_s > I_{ref}$ with the increase in the light output $P_0$ and the accompanying increase in the photovoltaic current $I_s$, a base current that corresponds to the difference between the photovoltaic current $I_s$ and the reference current Iref flows in the controlling transistor $Q_1$, and an amplified current of the difference current flows to the collector of the controlling transistor $Q_1$. Because of this, the base bias current of the driving transistor $Q_2$ is decreased by the corresponding amount. Then, the driving transistor $Q_2$ is driven by the inverting amplification current of the controlling transistor $Q_1$, and the driving transistor $Q_2$ controls the forward current $I_f$ of the laser diode $L_D$ in response to the size of the difference current between the photovoltaic current Is and the reference current $I_{ref}$, reducing the value of the current $I_f$.

In connection with the above numerical example, if the reference current $I_{ref}$ of the reference current source 1 is set at 0.75 mA, the forward current $I_f$ of the laser diode LD is controlled to become 90 mA that corresponds to this reference current 0.75 mA. As a result, control is carried out to have a constant light output $P_0$ of 10 mW.

Further, as shown in the circuit configuration of FIG. 1, the control current that is obtained by the forward current circuit 4 includes the component of the photovoltaic current $I_s$ that flows to the photodiode PD. Therefore, the control operation for the forward current $I_f$ generates an error which is equal to the amount of photovoltaic current $I_s$. However, the photovoltaic current $I_s$ has a value which is less than 1/100 of the forward current $I_f$, as shown in the above example. Therefore, the above error is almost negligible so that the control current that flows in the forward current circuit 4 may safely be regarded to be equal to the forward current $I_f$ of the laser diode LD.

In such an output stabilization operation, in the present embodiment, only two transistors, namely, the controlling transistor $Q_1$ and the driving transistor $Q_2$, and a current controlling resistor $R_1$ are connected to the feedback circuit 3, having an extremely small number of components and a simple circuit configuration compared with the existing system. Accordingly, the response lag of the feedback system for the changes in the light output $P_0$ is very small so that an appropriate stabilization operation can be obtained even if the laser diode LD is pulse-driven at high frequency. This will be explained further in connection with the next example.

Figure 4:
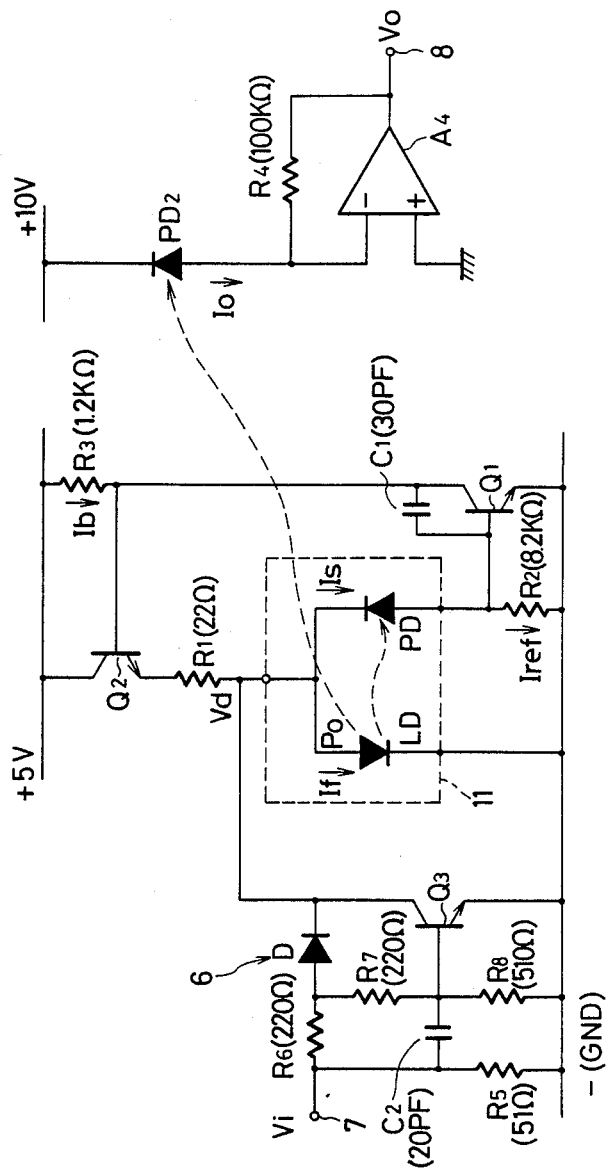
FIG. 4 is a circuit diagram for showing a concrete example of the laser diode driving circuit shown in FIG. 1, FIGS. 5A-5C illustrate waveform diagrams for showing the pulse driving characteristics of the circuits shown in FIG. 4.

Next, in FIG. 4 is shown a concrete example of the first embodiment. In this concrete example, the laser diode LD is driven b high frequency pulsed current, and its pulsed light output is attempted to be detected by a photodiode sensor $PD_2$ that is provided externally.

In FIG. 4, reference numeral 6 is a switching circuit for switch-driving the laser diode LD. This fast switching circuit consists of a switching transistor $Q_3$, resistors $R_5$ to $R_8$, a capacitor $C_2$, and a diode D. Reference numeral 7 is a voltage input terminal for inputting a pulsed voltage for driving the switching circuit 6.

Further, to the photodiode sensor $PD_2$ there is connected a sense amplifier for outputting a voltage output $V_0$ from an output terminal 8 by amplifying the detected photovoltaic current $I_0$. The sense amplifier consists of an operating amplifier $A_4$ and a feedback resistor $R_4$.

In this concrete example, the reference current source consists of a resistor $R_2$ of resistance 8.2 kΩ. If the required voltage between the base and the emitter $V_{BE}$ is, for example, 0.6 V, the reference current Iref is set at 0.6 V/8.2 kΩ = 73 μA.

Therefore, the light output $P_0$ of the laser diode LD is controlled so as to let the photovoltaic current $I_s$ of the photodiode PD have a value that corresponds to 73 μA of the reference current $I_{ref}$. Then, by applying the proportionality relation between the two quantities given by Eq. (1) as it is, there will be obtained a light output $P_0$ of about 1 mW from the laser diode LD.

Figure 5:
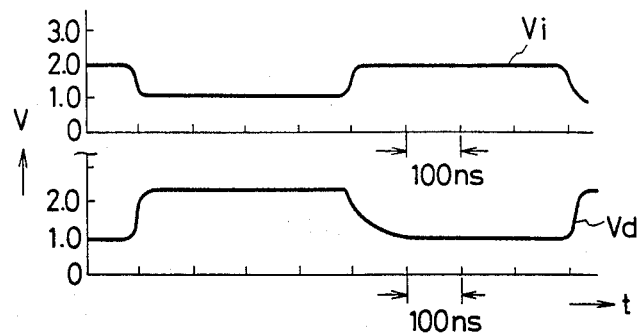
Figure 5:
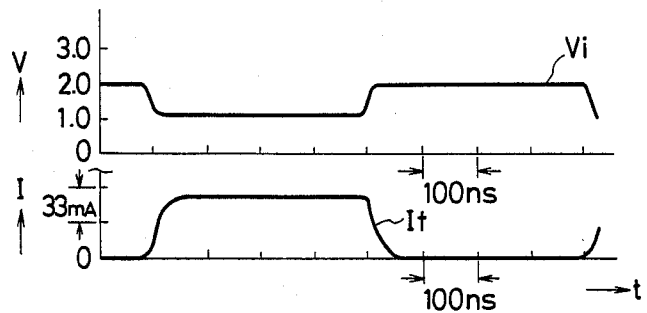
Figure 5:
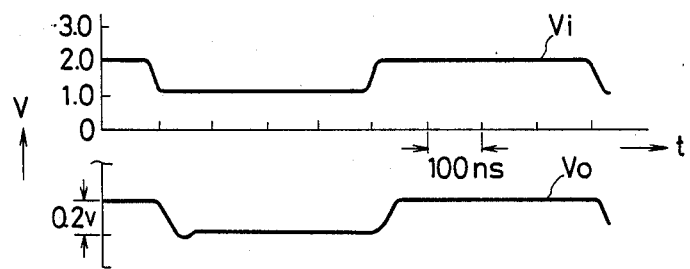

The pulse response characteristics of such a concrete example, obtained when the laser diode LD is pulse-driven by inputting from the voltage input terminal 7 a pulsed voltage of repetition frequency of 1 MHz as the input voltage $V_i$, are shown in FIGS. 5 (A), 5 (B), and 5 (C). FIG. 5 (A) is a diagram for illustrating the response characteristics between the input voltage $V_i$ and the anode voltage (driving voltage) $V_d$ of the laser diode LD, FIG. 5 (B) is a diagram for illustrating the response characteristics between the input voltage $V_i$ and the forward current $I_f$ of the laser diode LD, and FIG. 5 (C) is a diagram for illustrating the response characteristics between the input voltage $V_i$ and the voltage output $V_0$ to the outside.

From the characteristics shown in FIG. 5 (B), it will be seen that a forward current $I_f$ of about 58 mA is flowing in the laser diode LD during the time of its lighting.

Further, the pulsed output voltage $V_0$ which is output from the output terminal 8 through the external detection system that consists of the photodiode sensor $PD_2$ and the sense amplifier, has an amplitude of about 0.2 V and the rise time $t_r$ and the fall time $t_f$ of about 40 nsec and 50 nsec, respectively, which shows a very fast pulse response. It was confirmed that the light output $P_0$ in such a pulse drive can also be controlled to a constant value in a stable manner. Here, the rise time $t_r$ and the fall time $t_f$ are values that include the response lag of the sense amplifier itself and others.

Incidentally, when the amplitude of the output voltage is 0.2 V, the photovoltaic current $I_0$ that flows in the photodiode sensor $PD_2$ has a value which is obtained by dividing the output amplitude value by the feedback resistance $R_4$ = 100 kΩ of the operational amplifier $A_4$, namely, 0.2 V/100 kΩ = 2 μA.

Figure 6:
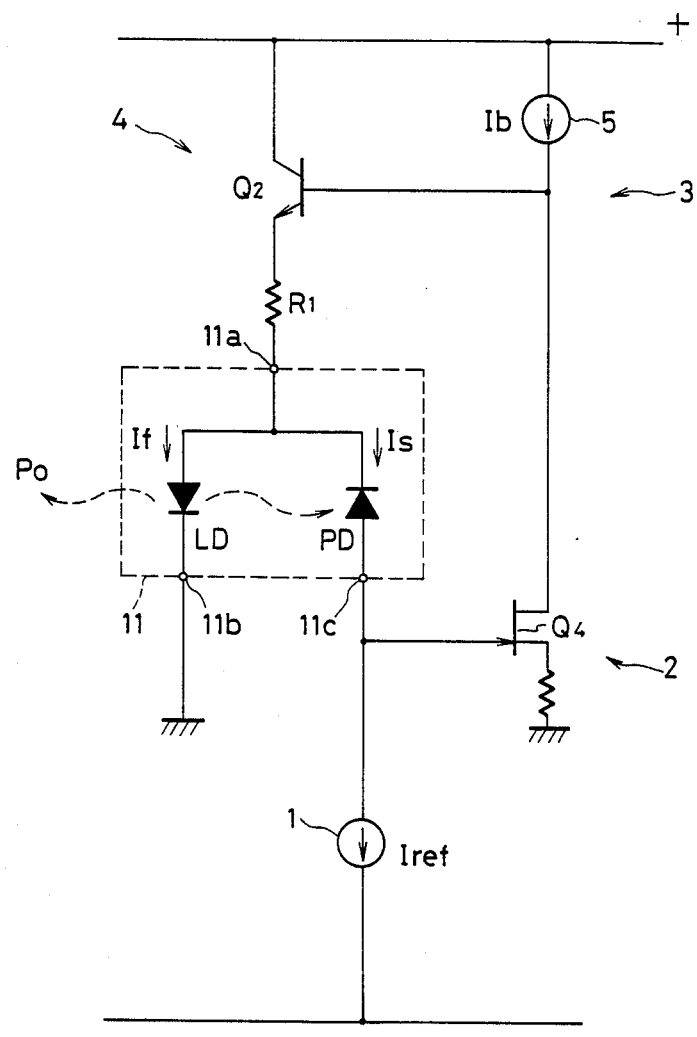
FIG. 6 is a circuit diagram for showing a first modification to the first embodiment.

In FIG. 6 there is shown a first modification to the first embodiment. In this modification, as the controlling transistor, use is made of a junction type field effect transistor (JFET) $Q_4$, instead of the npn transistor $Q_1$ in the first embodiment, to enhance further the control accuracy of the light output $P_0$.

Except for the fact that use is made of the JFET $Q_4$, the remaining configuration of the circuit is the same as for the first embodiment shown in FIG. 1.

As was mentioned in connection with the concrete example shown in FIG. 4, the reference current $I_{ref}$ is given a value which is less than about 100 μA, and the light output $P_0$ is controlled in such a way as the photovoltaic current $I_s$ of the photodiode PD thus generated has a value corresponding to the reference current $I_{ref}$. The photovoltaic current $I_s$ of the photodiode PD has a small value as mentioned in the above so that when an npn transistor $Q_1$ is used as the controlling transistor as in the first embodiment, there will flow a base current of the order of μA in the npn transistor $Q_1$, and hence a control error of the size of the base current will be generated due to inclusion of the base current in the photovoltaic current $I_s$.

In contrast, in the first modification, by the use of a JFET which has a high gate input impedance as the controlling transistor, the above control error is arranged to be eliminated by making the gate current to be almost nonexistent.

Figure 7:
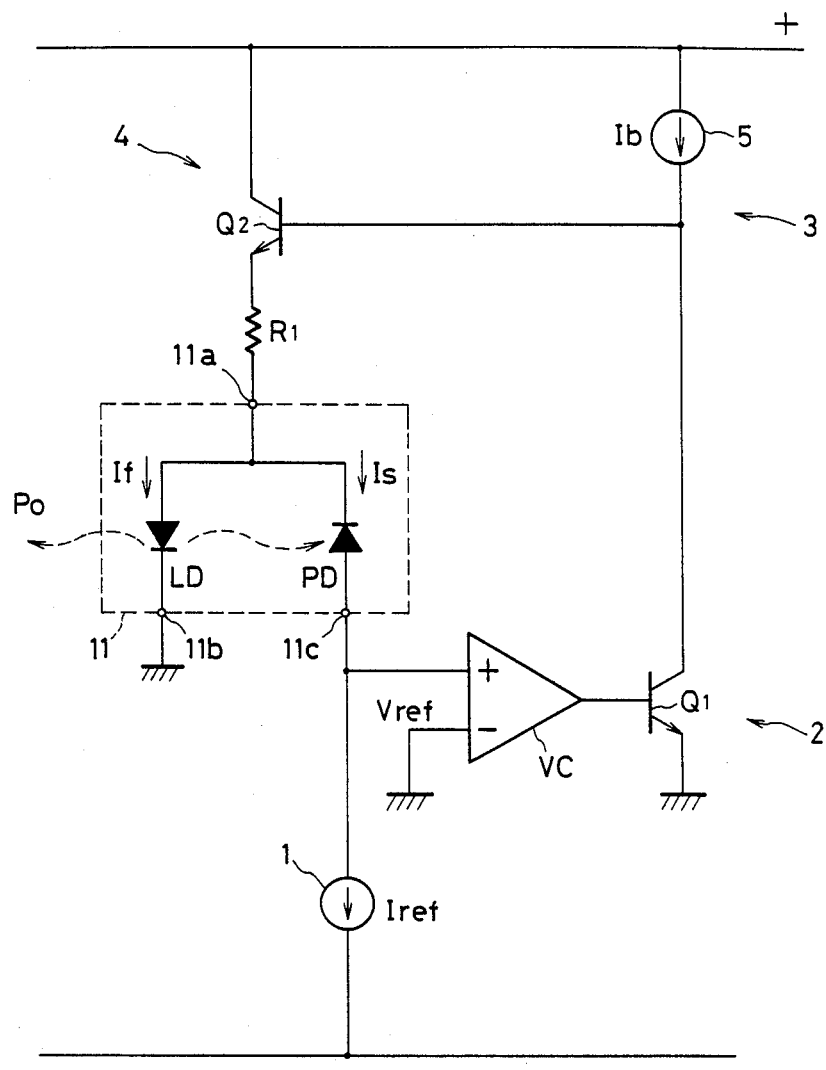
FIG. 7 is a circuit diagram for showing a second modification to the first embodiment.

In FIG. 7, there is shown a second modification to the first embodiment.

In this modification, the control accuracy is attempted to be improved further by connecting a voltage comparator VC between the junction of the photodiode PD and the reference current source 1, and the base of the controlling transistor $Q_1$. In the example of the figure, the reference voltage $V_{ref}$ of the voltage comparator VC is set at ground potential.

In this modification, the signal that corresponds to the difference between the reference current $I_{ref}$ of the reference current source 1 and the photovoltaic current $I_s$ of the photodiode PD is inverted and amplified by the controlling transistor $Q_1$ via the voltage comparator VC. The amplified output is fed back to the forward current circuit 4 to control the forward current $I_f$ of the laser diode LD to a current value that corresponds to the reference current $I_{ref}$. Such a fundamental operation is similar to the case of the first embodiment.

In the above control operation for this modification, the anode voltage of the photodiode PD is set to be equal to the reference voltage $V_{ref}$ of the voltage comparator VC, namely, the ground potential.

When the anode of the photodiode PD is connected directly to the base of the controlling transistor $Q_1$, the anode potential of the photodiode PD has a temperature dependence under the influence of the temperature characteristics of the controlling transistor $Q_1$, which generates a temperature dependence also in the stabilized operation of the light output.

However, in the present modification, the voltage of the photodiode PD is prescribed to the reference voltage $V_{ref}$ of the voltage comparator VC, and the effect of the temperature characteristics of the controlling transistor $Q_1$ is eliminated.

Further, if, for instance, the anode potential of the laser diode LD is 1.5 V and the base-emitter voltage $V_{BE}$ of the controlling transistor $Q_1$ is 0.6 V, the photodiode PD in the case of the first embodiment will be operated by a reverse bias voltage of 1.5 V − 0.6 V = 0.9 V. However, in the present modification, the anode of the photodiode PD is set at the ground level which is the reference voltage $V_{ref}$ for the voltage comparator VC. Consequently, the reverse bias voltage becomes 1.5 V − 0 V = 1.5 V so that it is set at a value which is larger than for the first embodiment. Because of this, the detection sensitivity of the photodiode PD is improved, and together with the removal of the influence of the temperature characteristics, the stabilized operation of the light output $P_0$ of the laser diode LD will be made more accurate.

It should be noted that $V_{ref}$ may be set at a potential other than that of the ground. By so doing, it will become possible to set the reverse bias voltage for the photodiode at larger value.

Figure 10A:
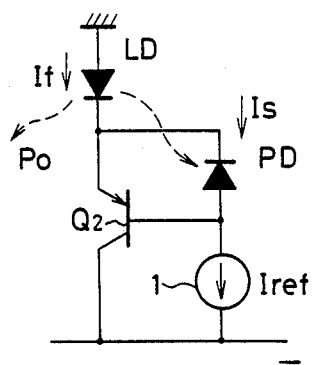
FIG. 10A and 10B illustrate circuit diagrams for showing the important part of a fifth modification to the first embodiment.
Figure 10B:
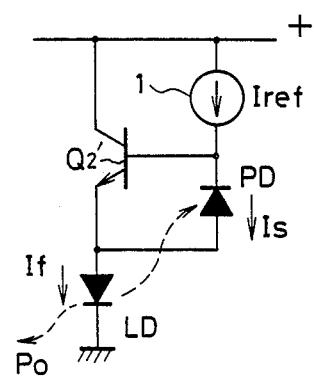

Next, in the third to the fifth modifications shown in FIGS. 8 to 10, respectively, the restrictions on the connection mode in which the laser diode LD and the photodiode PD are built in one package 11 and the anode of the laser diode LD and the cathode of the photodiode PD are jointly connected, are relaxed, and examples of configurations are shown in which the laser diode LD and the photodiode PD may be connected in an arbitrary manner.

Namely, the possible connection modes of the laser diode LD and the photodiode PD include (a) a mode of jointly connecting the anode of the laser diode LD and the cathode of the photodiode PD; (b) a mode of jointly connecting the cathode of the laser diode LD and the anode of the photodiode PD; (c) a mode of mutually and jointly connecting the cathodes of the laser diode LD and the photodiode PD; (d) a mode of mutually and jointly connecting the anodes of the laser diode LD and the photodiode PD; and (e) a mode that does not jointly connect the laser diode LD and the photodiode PD. In what follows, the modifications to the laser diode driving circuit that are constructed in accordance with each of the connection modes that are enumerated in the above.

First, FIG. 8 (A) shows a third modification to the present invention. This modification uses a npn transistor as a driving transistor $Q_2$, and by connecting the junction of the reference current source 1 and the photodiode PD directly to the base of the driving transistor $Q_2$ to omit the arrangement of a transistor that corresponds to the controlling transistor $Q_1$ in the first embodiment, with a main purpose of further simplifying the circuit configuration. The laser diode LD is connected to the emitter circuit of the driving transistor $Q_2$ which is connected as an emitter follower.

To describe the operation, in a state in which the relation between the photodiode current $I_s$ and the reference voltage $I_{ref}$ satisfy the condition $I_s < I_{ref}$, a base current that corresponds to the difference between the photovoltaic current $I_s$ and the reference current $I_{ref}$ flows in the base of the driving transistor $Q_2$, and a forward current $I_f$ that corresponds to the amplified current of the difference current flows in its emitter circuit. Then, in the laser diode LD, the light output $P_0$ is increased by the amplified forward current $I_f$. In this way, in this modification, the forward current $I_f$ is also inverted and increased corresponding to the difference current between the photovoltaic current $I_s$ and the reference current $I_{ref}$, and the light output $P_0$ is increased.

As the light output $P_0$ is increased, and the photovoltaic current $I_s$ is increased accordingly to satisfy the relation $I_s > I_{ref}$, the base current of the driving transistor $Q_2$ vanishes, the driving transistor $Q_2$ turns off to cut off the forward current $I_f$, and the light output $P_0$ is reduced.

By a feedback operation as in the above, the light output $P_0$ of the laser diode LD is controlled to become constant at an output value for which the photovoltaic current $I_s$ of the photodiode PD equals the reference current $I_{ref}$. In this modification, the number of components in the circuit is small so that a more satisfactory effect can be obtained in view of the fast driving capability.

In this modification, it is possible to jointly connect the anode of the laser diode LD and the cathode of the photodiode PD.

FIG. 8 (B) is a complementary circuit to the circuit shown in FIG. 8 (A) obtained by the use of an npn transistor as the driving transistor $Q_2'$. Its operation is similar to that of the circuit shown in FIG. 8 (A).

In this circuit, it is possible to jointly connect the cathode of the laser diode LD and the anode of the photodiode PD.

In FIG. 9 (A) is shown a fourth modification to the present invention. In this modification, a npn transistor is used as the driving transistor $Q_2$, and the aspect that the junction of the reference current source 1 and the photodiode PD is connected to the base of the driving transistor $Q_2$ is the same as in the third modification shown in FIG. 8 (A). What is different is that the laser diode LD is connected to the collector circuit of the driving transistor $Q_2$.

The operation of detecting a photovoltaic current $I_s$ that corresponds to the light output $P_0$ by the photodiode PD, and controlling, by the feedback of the detected value, the light output $P_0$ so as to be constant at an output value for which the photovoltaic current $I_s$ becomes equal to the value that corresponds to the reference current $I_{ref}$, is similar to the case of the third modification.

FIG. 9 (B) is a complementary circuit to the circuit of FIG. 9 (A), obtained by the use of an npn transistor as the driving transistor $Q_2'$. Its operation is similar to the case of FIG. 9 (A).

In FIG. 10 (A) is shown a fifth modification to the present invention. In this modification, the cathode of the laser diode LD and the cathode of the photodiode PD are jointly connected, and it shows the circuit configuration for the case in which there exists a restriction that a common connecting terminal is drawn out from the connecting point.

Except for the fact that the cathode of the photodiode PD and the cathode of the laser diode are connected as in the above, the circuit components are similar to the case of the third modification shown in FIG. 8 (A).

In this modification, the sum of the controlling current that flows in the driving transistor $Q_2$ and the photovoltaic current $I_s$ that flows in the photodiode PD, flows in the laser diode LD as a forward current $I_f$. Because of this, between the forward current $I_f$ and the controlling current, there exists an error which corresponds to the photovoltaic current $I_s$. However, the photovoltaic current $I_s$ has a value which is less than 1/100 of the forward current $I_f$ as mentioned earlier so that the above error can be neglected almost completely, and the controlling current that flows in the driving transistor $Q_2$ may safely be regarded to be equal to the forward current $I_f$ of the laser diode.

Accordingly, the stabilized controlling action of the light output $P_0$ by means of the present modification is substantially the same as in the third modification.

FIG. 10 (B) is constructed as a complementary circuit to the circuit shown in FIG. 10 (A) by employing a npn transistor as the driving transistor $Q_2'$. Its operation is approximately the same as that of FIG. 10 (A).

Figure 11:
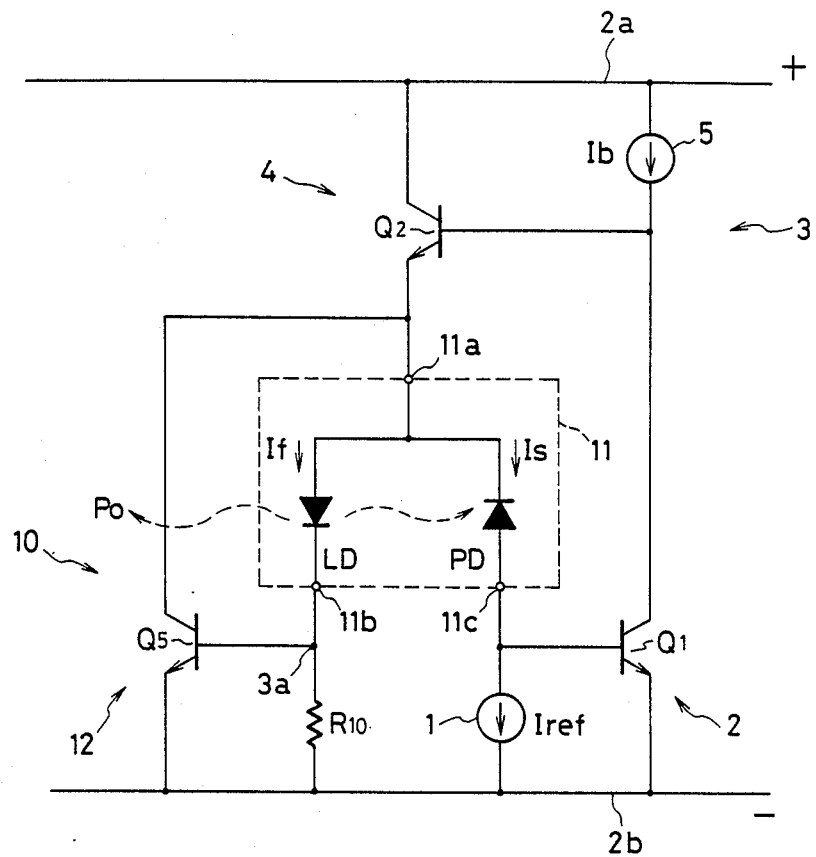
FIG. 11 is a circuit diagram for a second embodiment of the laser diode driving circuit that has an excess current protective circuit in accordance with the present invention, FIGS. 12A and 12B give the characteristic diagrams for the relation between the forward current and the light output in the laser diode used in the laser diode driving circuit of FIG. 11, and the relation between the light output of the laser diode and the monitor current of the photodiode.

FIG. 11 shows a second embodiment of the present invention.

The second embodiment is obtained by attaching an excess current protective circuit 10 to the laser diode driving circuit which has a controlling circuit for output stabilization shown in the first embodiment. In the laser diode driving circuit shown in FIG. 11, the current driving resistor $R_1$ which was connected in series to the anode of the laser diode in the first embodiment is taken away, and in its place there is connected in series a voltage detecting resistor $R_{10}$ to the cathode of the laser diode LD to let the resistor $R_{10}$ to play the function of a current limiting resistor to some extent. Here, for the components in FIG. 11 which are identical to those in FIG. 1 are given identical symbols to omit a repeated explanation.

In the excess current protective circuit, a forward current limiting circuit (forward limiting means) 12 that has a limiting transistor $Q_5$ is connected to a forward current circuit 4. The mode of connection is such that the collector of the limiting transistor $Q_5$ is connected to the common connecting terminal 11a, and its emitter is connected to a negative power supply line 2b. Between the cathode terminal 11b of the laser diode in the forward current circuit 4 and the power supply line 2b, there is connected the detecting resistor $R_{10}$ for taking out the voltage drop due to the forward current $I_f$ as a detected voltage, and the take-out point 3a of the detected voltage is connected to the base of the limiting transistor $Q_5$.

The resistance of the detecting resistor $R_{10}$ is prescribed as $$R_{10} = V_{BE}/I_{fmax}, \qquad (2)$$

where $I_{fmax}$ is the maximum rated value (limited current value) of the forward current $I_f$ of the laser diode LD and $V_{BE}$ is the base-emitter voltage that is needed for making the limiting transistor $Q_5$ a conducting state (assuming that the symbol for the resistor $R_{10}$ represents the resistance as is).

Next, referring to FIGS. 12 (A) and 12 (B), the operation of the circuit will be described.

Figure 12B:
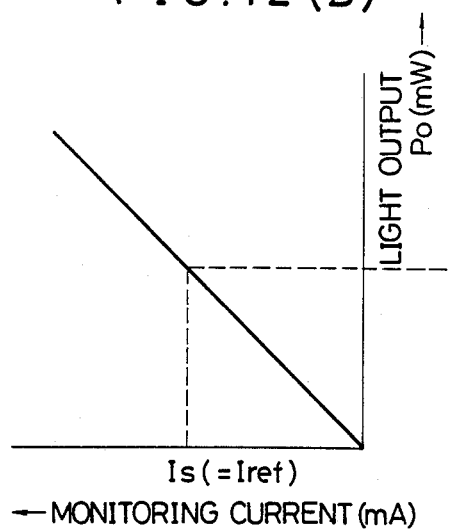
Figure 12A:
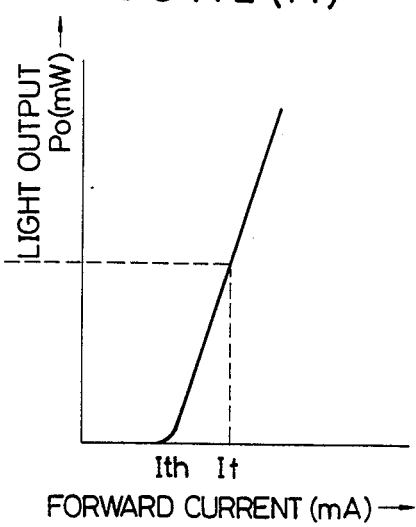

FIG. 12 (A) is a characteristic diagram for showing the relation between the forward current $I_f$ of the laser diode LD and the light output $P_0$, and FIG. 12 (B) is a characteristic diagram for showing the relation between the light output $P_0$ of the laser diode LD and the monitoring current (photovoltaic current $I_s$) that is generated in the photodiode PD.

From FIG. 12 (A) it will be seen that the laser diode LD outputs a light output $P_0$ by laser oscillation when the forward current $I_f$ reaches a certain "threshold current value" $I_f'$, and thereafter the light output $P_0$ increases in proportion to the forward current $I_f$. On the other hand, the photovoltaic current $I_s$ is generated upon receipt of the light output $P_0$ in which the photovoltaic current $I_s$ increases in proportion to the light output $P_0$.

As described earlier in connection with the first embodiment, the photovoltaic current $I_s$ that is detected by the photodiode PD is proportional to the light output $P_0$, so that the light output $P_0$ is feedback-controlled at a constant value in a stabilized manner, so as to have a value that corresponds to the reference current $I_{ref}$.

Assuming that the light output $P_0$ is controlled to be constant at approximately a maximum rated output value of $P_{0max}$ in the neighborhood of the maximum rated value $I_{fmax}$ of the forward current $I_f$ of the laser diode LD, and the forward voltage drop $V_f$, the maximum consumed power $P_{dmax}$ of the laser diode LD is given by $$P_{dmax} = V_f I_{fmax} \qquad (3)$$

The laser diode LD maintains a normal laser oscillation state in the range below the maximum consumed power $P_{dmax}$.

In a normal output stabilized state as in the above, the detected voltage $I_f R_{10}$ which is detected by the detecting resistor $R_{10}$ has a value less than the voltage $V_{BE}$ between the base and the emitter of the limiting transistor $Q_5$, so that the forward current limiting circuit 12 is not affected at all.

However, if an excess current which is greater than the maximum rated value $I_{fmax}$ flows in the forward current circuit 4 for some reason, then the detected voltage that is taken out from the detecting resistor $R_{10}$ exceeds the voltage $V_{BE}$ between the base and the emitter of the limiting transistor $Q_5$. As a result, the limiting transistor $Q_5$ becomes turned on, a portion of the forward current is bypassed in a collector-emitter path of the transistor $Q_5$ that constitutes the forward current limiting circuit 12, and the flow of an excess current which is greater than the maximum rated value (limited current value) of the laser diode LD is controlled. Accordingly, the laser diode LD is protected from thermal breakdown caused by the excess current.

When the excess current state is stopped, the forward current limiting circuit 12 returns to the original nonactive state, and the system goes back to the normal output stabilized state by the driving system circuit.

Figure 13:
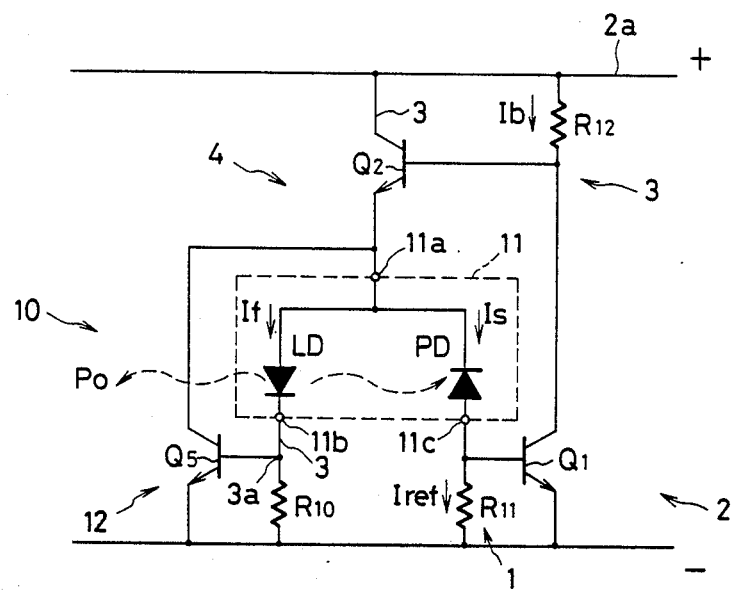
FIG. 13 is a circuit diagram for showing a first modification to the second embodiment.

Next, in FIG. 13, there is shown a first modification to the second embodiment. This modification is obtained by constituting the reference current source 1 by a resistor $R_{11}$. If the required voltage between the base and the emitter of the controlling transistor $Q_1$ is called $V_{BE2}$, then the resistance $R_1$ is fixed so as to satisfy $I_{ref} = V_{BE2}/R_1$. Further, the bias current circuit 5 consists of a resistor $R_{12}$.

Figure 14:
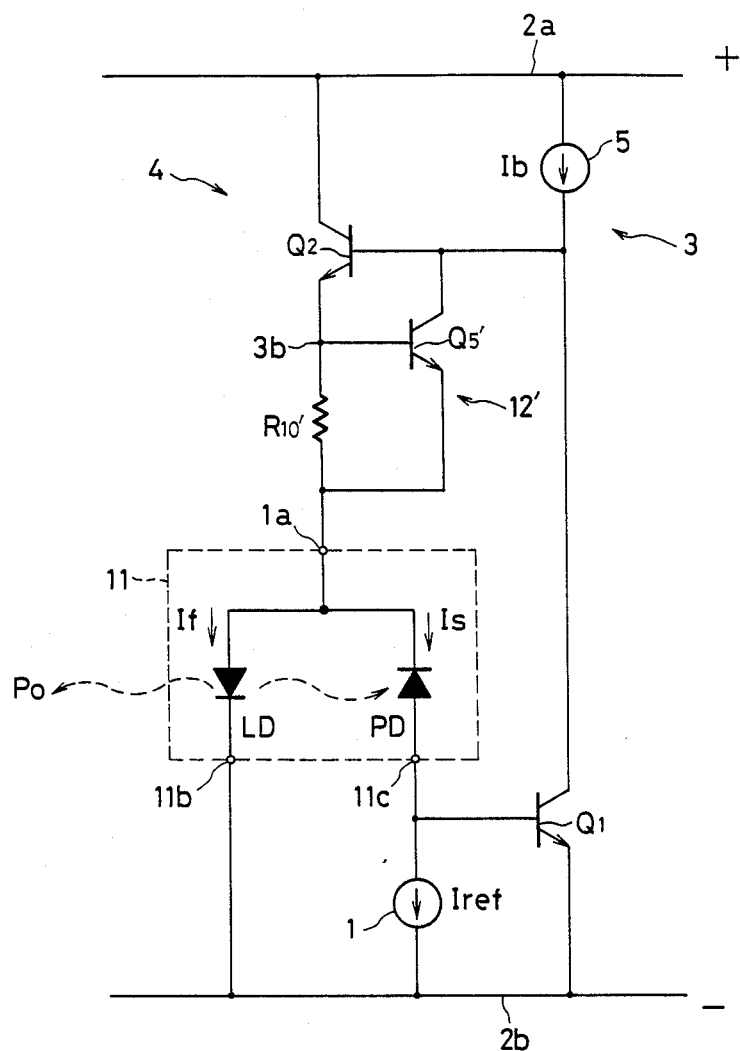
FIG. 14 is a circuit diagram for showing a second modification to the second embodiment.

Next, in FIG. 14 is shown a second modification to the second embodiment. In this modification, a detecting resistor $R_{10}'$ is connected between the emitter of the driving transistor $Q_2$ and the jointly connecting terminal 1a, and the limiting transistor $Q_5'$ is connected between the base of the driving transistor $Q_2$ and the jointly connecting terminal 1a. Further, the detected voltage take-out point 3b is connected to the base of the limiting transistor $Q_5'$. As in the above, in the present modification, a forward current limiting circuit 12' is arranged in a part of the forward current circuit 4 on the side of anode of the laser diode LD. Other configuration is approximately the same as that shown in FIG. 11.

To describe its operation, if an excess current which exceeds a maximum rated value $I_{fmax}$ flows in the forward current circuit 4 for some reason, then the value of the detected voltage that is taken out from the detecting resistor $R_{10}'$ exceeds the voltage $V_{BE}$ between the base and the emitter of the limiting transistor $Q_5'$. As a result, the limiting transistor $Q_5'$ becomes turned on, the current amplification factor of the driving transistor $Q_2$ is reduced due to the flow of a part of the base bias current of the driving transistor $Q_2$ into the forward current limiting circuit 12', so that flow of an excess amount of the forward current in the laser diode LD is suppressed. Therefore, analogous to the previous modification, the laser diode LD can be protected from thermal breakdown caused by an excess current.

In the second modification, current that flows in the detecting resistor $R_{10}'$ includes the photovoltaic current $I_s$ that flows in the laser diode LD in addition to the forward current $I_f$, and the photovoltaic current $I_s$ becomes a factor in the errors. However, the photovoltaic current $I_s$ has a value less than 1/100 of the forward current $I_f$ as mentioned earlier, so that the error in the detected voltage due to the photovoltaic current $I_s$ can be neglected almost completely.

Figure 15:
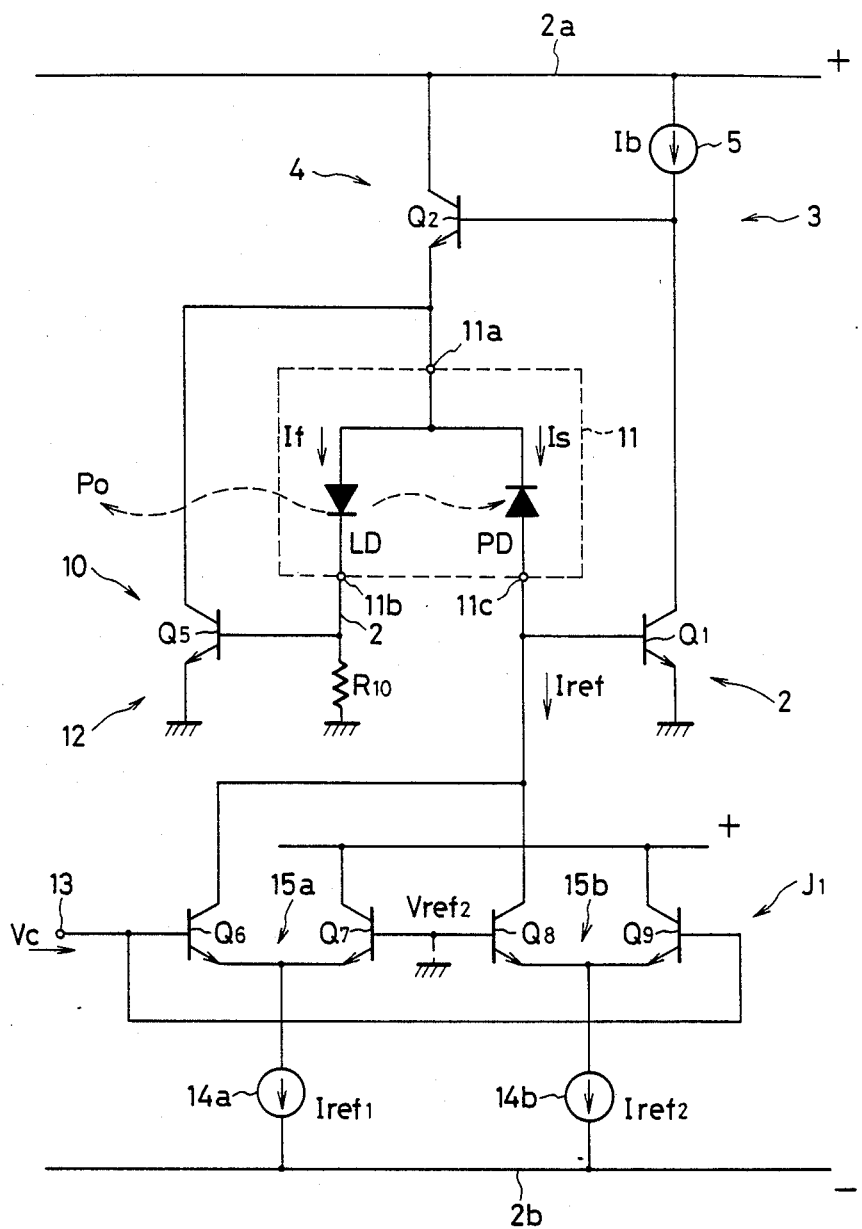
FIG. 15 is a circuit diagram for a third embodiment of the laser diode driving circuit that has a reference current switching circuit of the present invention, FIGS. 16A and 16B give the characteristic diagrams for the relation between the forward current and the light output, and the relation between the light output of the laser diode and the monitor current of the photodiode, for the laser diode used in the laser diode driving circuit shown in FIG. 15.

FIG. 15 shows a third modification to the present invention. This modification is obtained from the second modification shown in FIG. 11 by replacing the reference current source 1 by a reference current switching circuit $J_1$. In FIG. 15, components identical to those in FIG. 11 are given identical symbols to omit repeated explanation.

Namely, between the anode terminal 11c of the photodiode PD and a negative power supply line 2b there is connected a reference current switching circuit $J_1$ which can set the reference current $I_{ref}$ to one of the two different current values $I_{ref1}$, and $I_{ref2}$ by switching. Reference numeral 14a is a first reference current source which sets the reference current to $I_{ref1}$, and 14b is a second reference current; source which sets the reference current to $I_{ref2}$. Reference numerals 15a and 15b are the first and the second differential amplifiers, and the two differential amplifiers 15a and 15b constitute the selector switch for switching between the reference current sources 14a and 14b.

The first differential amplifier 15a consists of a pair of transistors $Q_6$ and $Q_7$, while the second differential amplifier 15b consists of another pair of transistors $Q_8$ and $Q_9$. The collectors of the transistor $Q_6$ of the first differential amplifier 15a and the transistor $Q_8$ of the second differential amplifier 15b are jointly connected, and the junction is connected to the anode terminal 11c of the photodiode PD. In addition, the common junction of the emitters of the first differential amplifier 15a is connected to the first reference current source 14a, and the common junction of the emitters of the second differential amplifier 15b is connected to the second reference current source 14b.

Moreover, to the base of the transistor $Q_6$ in the first differential amplifier 15a and the base of the transistor $Q_9$ in the second differential amplifier 15b, there is applied a switch-controlling voltage $V_c$ from a controlling voltage input terminal 13. On the other hand, to the base of the transistor $Q_7$ in the first differential amplifier 15a and to the base of the transistor $Q_8$ in the second differential amplifier 15b, there is applied a reference voltage $V_{ref2}$ (ground potential for the example shown).

When the relation between the switch-controlling voltage $V_c$ and the reference voltage $V_{ref2}$ satisfies the relation $V_c > V_{ref2}$, the transistor $Q_6$ in the first differential amplifier 15a is shifted to on-state and the reference current $I_{ref}$ is set to the reference current $I_{ref1}$. When $V_c < V_{ref2}$, the transistor $Q_8$ in the second differential amplifier 15b is shifted to on-state and the reference current is switched to be set to the reference current $I_{ref2}$.

The selector switch that consists of the differential amplifiers 15a and 15b has a high speed switching capability that corresponds to the cut-off frequency of each of the transistors $Q_6$ to $Q_7$.

Next, referring to FIGS. 16 (A) and 16 (B), the operation of the above embodiment will be described.

FIG. 16 (A) is a characteristic diagram for showing the relation between the forward current $I_f$ of the laser diode LD and the light output $P_0$, and FIG. 16 (B) is a characteristic diagram for showing the relation between the light output $P_0$ of the laser diode LD and the monitoring current (photovoltaic current) $I_s$ that is generated in the photodiode PD.

From FIG. 16 (A) it will be seen that the laser diode LD is oscillated to give a light output when its forward current $I_f$ reaches a certain "threshold current value", and thereafter the light output increases in proportion to the forward current $I_f$. The characteristic line for the forward current $I_f$ versus the light output $P_0$ in this proportional region is fairly steep similar to the forward characteristic of the ordinary semiconductor. On the other hand, the photodiode generates a photovoltaic current $I_s$ upon receipt of the light output $P_0$, and the photovoltaic current $I_s$ increases in direct proportion to the light output $P_0$, as shown in FIG. 16 (B).

As in the above, the photovoltaic current $I_s$ that is detected by the laser diode LD is proportional to the light output $P_0$. Therefore, in the present invention, by feedback-controlling the light output $P_0$ so as to give the photovoltaic current $I_s$ a value that corresponds to the reference current $I_{ref}$, it becomes possible to avoid the instability in the controllability that occurs in the case of directly controlling the output level of the light output $P_0$, and to realize a stabilized control of the light output.

Namely, when the relation between the photovoltaic current $I_s$ and the reference current $I_{ref}$ is in the state $I_s < I_{ref}$, there flows no current to the base of the controlling transistor $Q_1$, and the controlling transistor $Q_1$ will find itself in an off-state. Then, a bias current $I_b$ flows from the bias current circuit 5 to the base of the driving transistor $Q_2$ to bring the driving transistor $Q_2$ to an on-state, and a maximum upper current that is prescribed by the detecting resistor $R_{10}$ flows into the laser diode LD to increase the light output $P_0$.

When the photovoltaic current $I_s$ is increased with the increase in the light output $P_0$ to have the relation $I_s > I_{ref}$, a base current which corresponds to the difference between the photovoltaic current $I_s$ and the reference current $I_{ref}$ flows into the controlling transistor $Q_1$, and an amplified current of the difference current flows into the collector of the controlling transistor $Q_1$. Because of this, an amount of current that corresponds to the amplified current flows from the bias current $I_b$ in the bias current circuit 5 to the side of the controlling transistor $Q_1$, and the base bias current of the driving transistor $Q_2$ is decreased by that amount. The driving transistor $Q_2$ is driven by the inverted amplified current in the controlling transistor $Q_1$, the forward current $I_f$ in the laser diode LD is reduced due to a decrease in the current amplification factor, and hence the light output $P_0$ is reduced.

By means of such a feedback operation, the light output $P_0$ of the laser diode LD is controlled to an output level so as to have the photovoltaic current $I_s$ of the photodiode PD to be equal to the value that corresponds to the reference current $I_{ref}$.

Now, the light output $P_0$ of the laser diode LD is controlled to the output level $P_{01}$ or $P_{02}$ that corresponds to the reference current value. When the value of the switch-controlling voltage $V_c$ that is applied to the voltage input terminal 13 in the reference current switching circuit $J_1$ is varied to satisfy $V_c > V_{ref2}$ or $V_c < V_{ref2}$, the output level of the light output $P_0$ of the laser diode LD is controlled to $P_{01}$ or $P_{02}$.

The relations among these values may be tabulated as in the following.

| $V_c \to V_c > V_{ref2}$, | $V_c < V_{ref2}$; |
|---|---|
| $I_s \to I_{s1} = I_{ref1}$, | $I_{s2} = I_{ref2}$; |
| $I_f \to I_{f1}$, | $I_{f2}$; |
| $P_0 \to P_{01}$, | $P_{02}$. |

In an optical disk device, the light outputs $P_{01}$ and $P_{02}$ of the laser diode LD may apply to read and write levels, respectively.

In the controlling operation of the present embodiment described in the above, only two transistors, namely, the controlling transistor $Q_1$ and the driving transistor $Q_2$, are connected to the feedback circuit 3, so that the circuit configuration is simple with very small number of component elements compared with the existing device. Therefore, the response lag of the feedback system for the changes in the light output $P_0$ is very small. Moreover, the selector switch that is composed of the differential amplifiers 15a and 15b has a very fast switchability so that there can be obtained a high speed controllability, namely, a high speed modulability of the output level of the light output $P_0$.

Next, in FIGS. 17 to 20 a practical example of the first embodiment will be shown.

Figure 17:
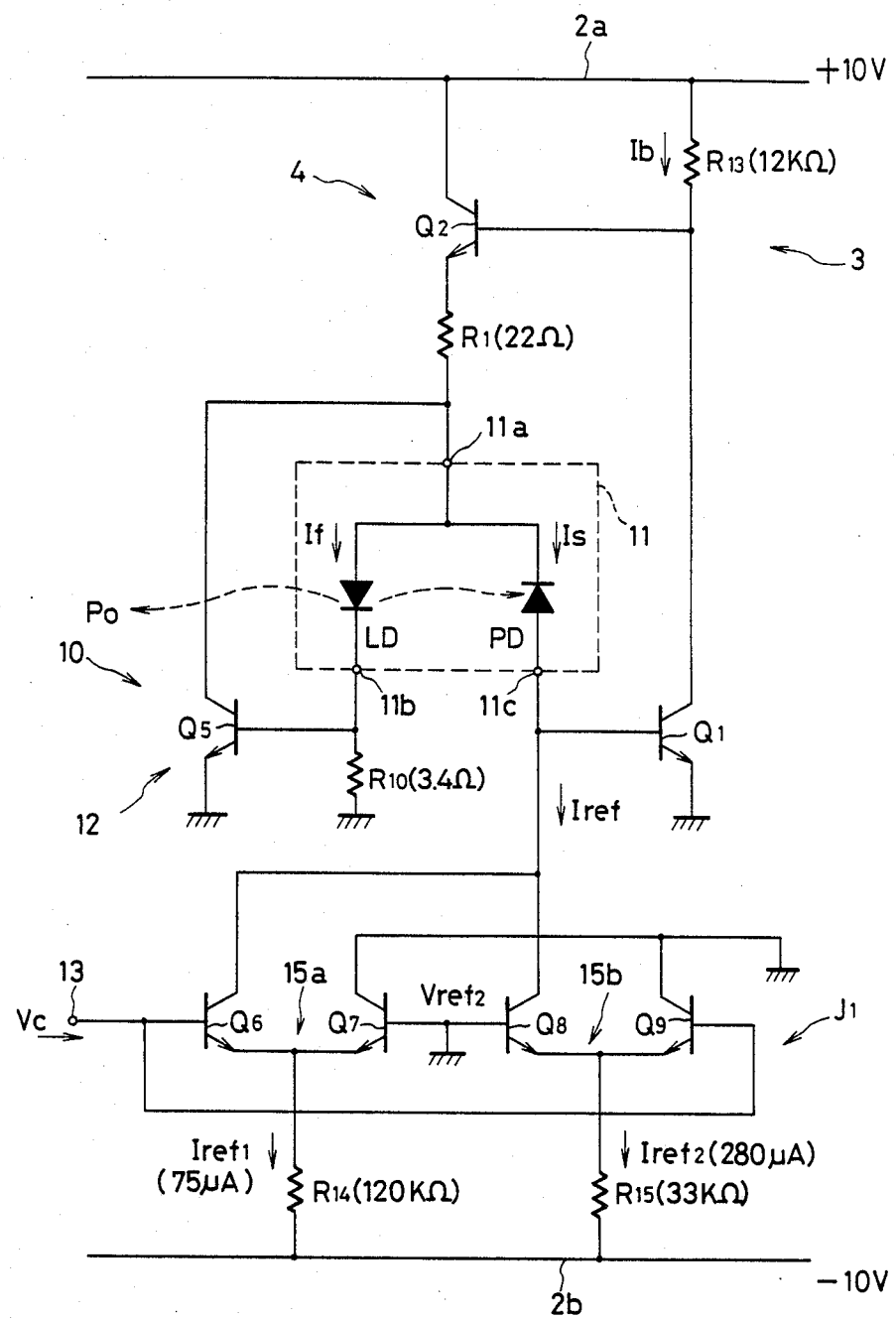
FIG. 17 is a circuit diagram for showing a concrete
Figure 18:
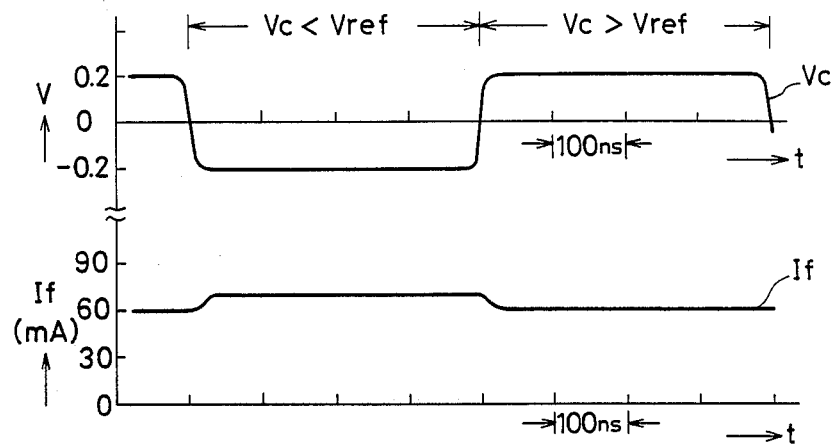
FIG. 18 gives characteristic diagrams that show the switching response characteristics of the forward current in the laser diode of FIG. 17.
Figure 19:
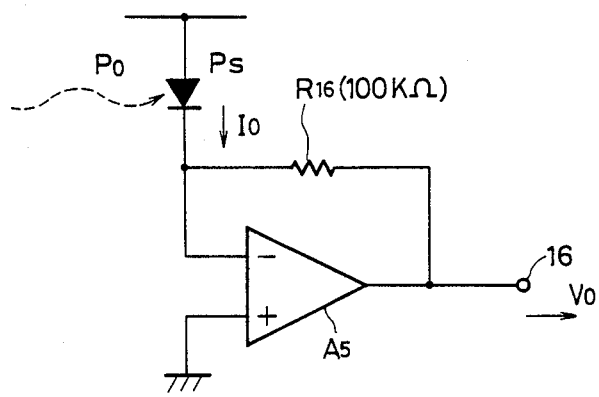
FIG. 19 is a circuit diagram for showing the external detection circuit of light output from the circuit of FIG. 17, FIGS. 20A and 20B give waveform diagrams that show the response characteristics of the output voltage that is output from the external detection circuit of FIG. 19.
Figure 20A:
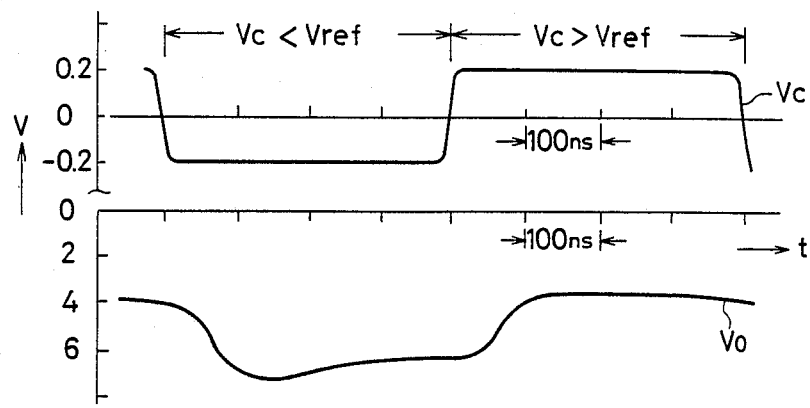
Figure 20B:
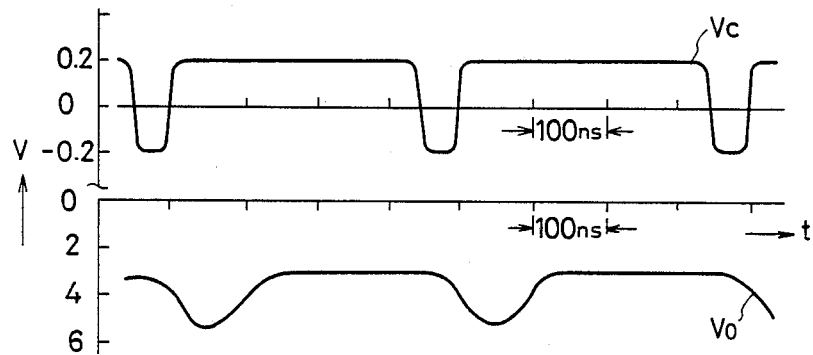

FIG. 17 is a circuit diagram for showing a practical circuit that corresponds to that in FIG. 15, FIG. 18 is a characteristic diagram for illustrating the response characteristics of the forward current $I_f$ in the laser diode LD corresponding to the voltage $V_c$ for switching control in the reference current switching circuit $J_1$, FIG. 19 is a circuit diagram for a detection circuit for detecting the light output $P_0$ from the outside, and FIG. 20 is a characteristic diagram for showing the response characteristics between the switch-controlling voltage $V_c$ and the output voltage $V_0$ which is output from the external detection circuit.

In FIG. 17, for example, the first reference current source 14a may consists of a resistor $R_{14}$ with resistance of 120 k$\Omega$ so that its reference current $I_{ref1}$ is set at 75 $\mu$A. In addition, the second reference current source 14b may consists of a resistor $R_{15}$ with resistance of 33 k$\Omega$ so that its reference current $I_{ref2}$ is set at 280 $\mu$A. Accordingly, the ratio of the two reference currents $I_{ref1}$ and $I_{ref2}$ is set at 1:4, and the output level of the light output $P_0$ is designed to be switching-controlled in the ratio of 1:4 for the reference currents $I_{ref}$.

In FIG. 17, the resistor $R_1$ which is connected to the forward current circuit 4 is a resistor for regulating the forward current to the maximum rated value.

When the switch-controlling voltage $V_c$ that is applied to the voltage input terminal 13 in such a concrete example is switched to have the relation $V_c > V_{ref2}$ or $V_c < V_{ref2}$, the measurement result on the response characteristics between the switch-controlling voltage $V_c$ and the forward current $I_f$ in the laser diode LD is shown in FIG. 18. From the figure, it will be seen that when the switch-controlling voltage $V_c$ is switched from $V_c > V_{ref2}$ to $V_c < V_{ref2}$ to switch the reference current $I_{ref}$ from $I_{ref1} = 75$ $\mu$A to $I_{ref2} = 280$ $\mu$A, the forward current $I_f$ in the laser diode LD is switched from $I_{f1} = 60$ mA to $I_{f2} = 70$ mA with the rise time $t_r$ for the forward current $I_f$ of about 20 nsec which signifies an extremely fast switching response. Further, from the characteristic curve of the light output $P_0$ for the forward current $I_f$ shown in FIG. 16, it is seen that the light outputs $P_0$ corresponding to the forward current $I_f$ of 60 mA and 70 mA are 1 mW and 4 mW, respectively, confirming that they are switching-controlled at the ratio of 1:4.

Next, the result of measurements on the response characteristics between the switch-controlling voltage $V_c$ and the light output $P_0$, with an externally provided detection circuit as shown in FIG. 19, will be described. In the detection circuit there are provided a photosensor $P_s$ and a sense amplifier which outputs a voltage output $V_0$ from the output terminal 16 after amplifying the photovoltaic current Is which is detected by the photosensor $P_s$. The sense amplifier consists of an operational amplifier $A_5$ and a feedback resistor $R_{16}$.

From the characteristics shown in FIG. 20 (A), it will be seen that when the switch-controlling voltage $V_c$ is switched from $V_c > V_{ref}$ to $V_c < V_{ref}$ and the reference current $I_{ref}$ is switched from $I_{ref1}$ to $I_{ref2}$, the output voltage $V_0$ that is detected by the external detection circuit has a rise time $t_r$ and the fall time $t_f$ at switching of respectively about 50 nsec, confirming an extremely fast switching response.

FIG. 20 (B) shows the measurement result on the pulse response of the output voltage $V_0$ for the case when switched pulse voltage with pulse width of 50 nsec is used as the switch-controlling voltage $V_c$. From the characteristics in the figure, it will be seen in this case, too, that the rise time $t_r$ and the fall time $t_f$ of the output pulse voltage $V_0$ are respectively about 50 nsec, confirming that a sufficiently fast response can be obtained in pulsed control also.

It should be mentioned that the rise time $t_r$ and the fall time $t_f$ in the above represent the values that include the response lag of the sense amplifier itself and other elements that exist in the external detection circuit.

Figure 21:
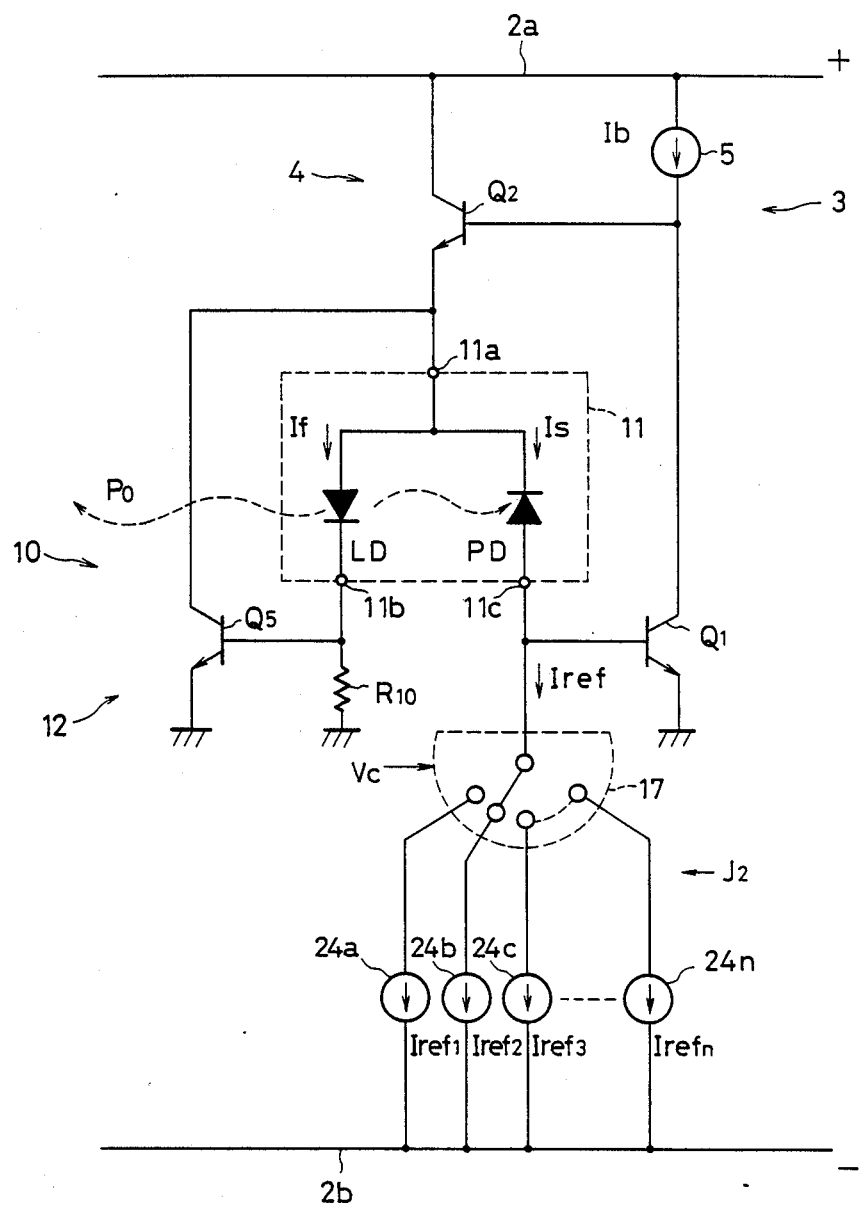
FIG. 21 is a circuit diagram for showing a first modification to the third embodiment.

In FIG. 21 is shown a first modification to the third embodiment. In this modification a total of n reference current sources 24a to 24n are provided in a reference current switching circuit $J_2$, and it is designed that the reference current $I_{ref}$ can be set to any one of the n values of $I_{ref1}$ to $I_{refn}$, by means of the selector switch 17.

In the figure, the selector switch 17 is depicted as a mechanical selector switch. However, analogous to the case of the first embodiment, it may be constructed by having a total of n differential amplifiers. The configuration other than the reference current switching circuit $J_2$ is the same as in the third embodiment.

According to this modification, it is possible to digitally modulate and control the output level of the light output $P_0$ of the laser diode LD in n different ways.

Figure 22:
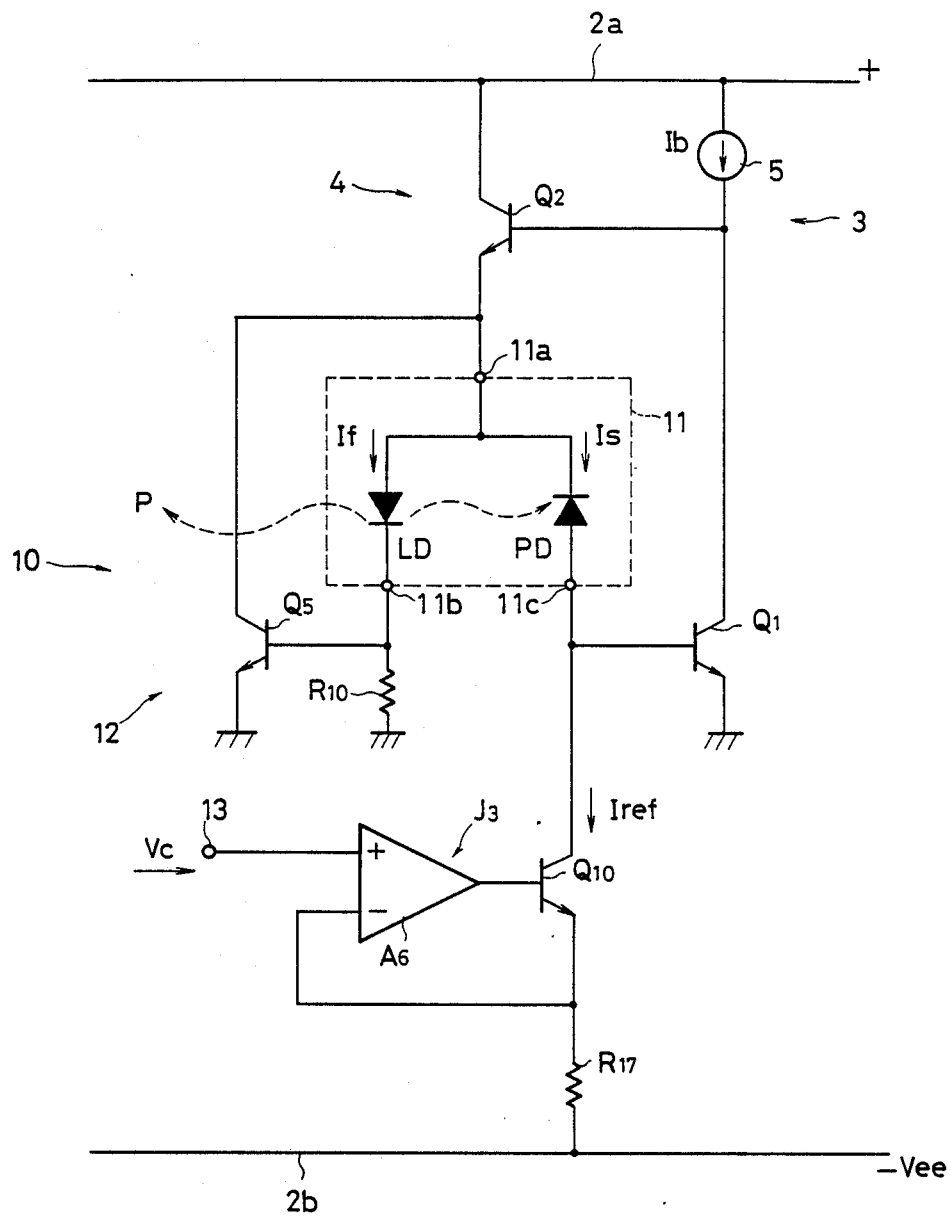
FIG. 22 is a circuit diagram for showing a second modification to the third embodiment.

In FIG. 22, there is shown a second modification to the third embodiment. This modification is constructed by employing a variable reference current source circuit for the reference current source circuit $J_3$ to be able to variably set the reference current $I_{ref}$ in an analog fashion.

The variable reference current source circuit $J_3$ is constructed with an operational amplifier $A_6$, an output transistor $Q_{10}$ of emitter-follower connection, and an emitter output resistor $R_{17}$.

At the junction of the emitter of the output transistor $Q_{10}$ and the emitter output resistor $R_{17}$, there will be generated a voltage that has the same value as the controlling voltage $V_c$, according to the principle of virtual short of the two input terminals of the operational amplifier $A_6$.

Accordingly, the reference current $I_{ref}$ may be prescribed by the following equation.

$$I_{ref}=[V_c-(-V_{ee})]/R_{17}$$

From the above equation it will be seen that the reference current $I_{ref}$ can be set variably in response to the voltage value of the controlling voltage $V_c$.

The configuration of the present modification is similar, except for the variable reference current source circuit $J_3$, to that of the third embodiment.

According to this modification, it becomes possible to modulate and control the output level of the light output $P_0$ of the laser diode LD in an analog manner.

Figure 23:
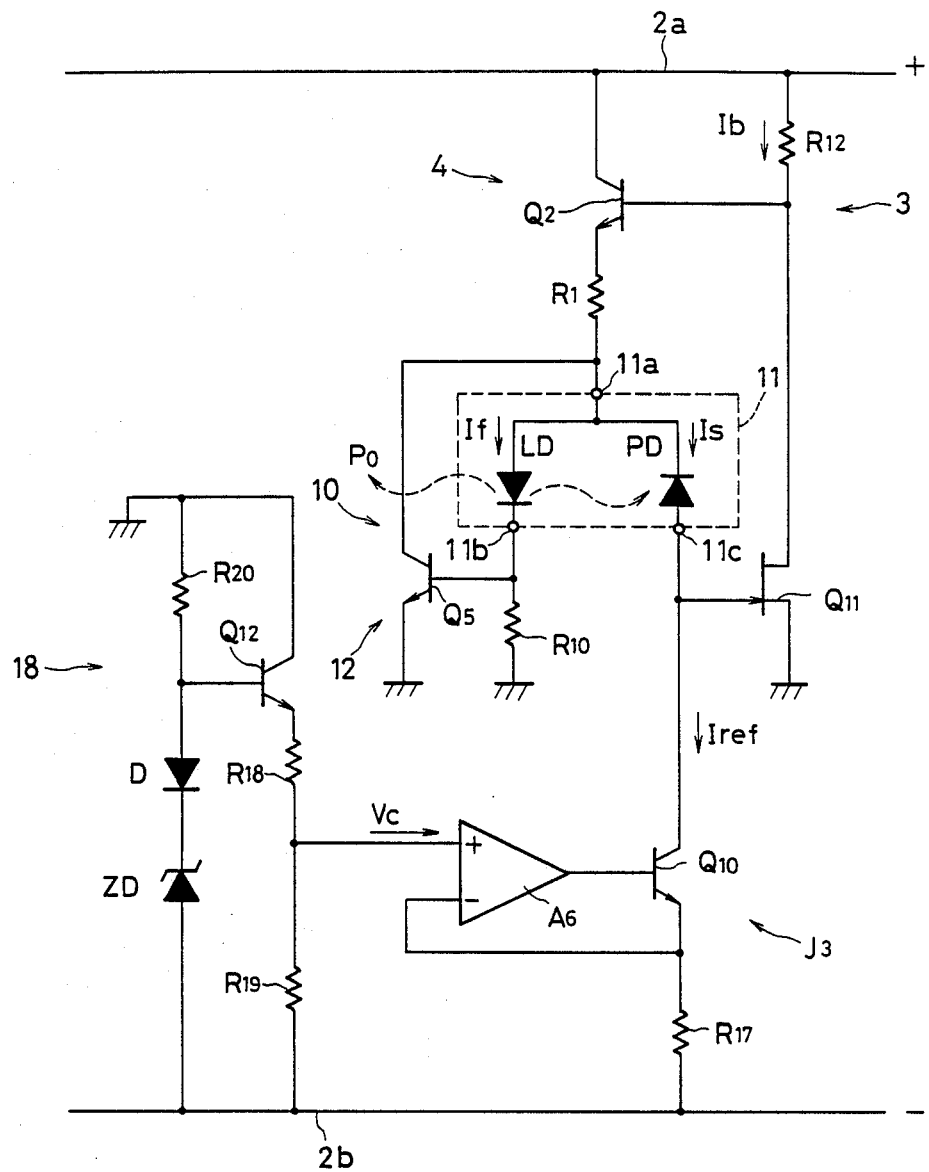
FIG. 23 is a circuit diagram for a fourth embodiment of the laser diode driving circuit that has an excess current protective circuit, of the present invention.

FIG. 23 is a diagram for showing a fourth embodiment of the present invention.

In this embodiment, the reference current source 1 in the second embodiment shown in FIG. 11 is replaced by the variable reference current source circuit $J_3$ that consists of the transistor $Q_{10}$ and the operational amplifier $A_6$ shown in FIG. 22, and a temperature compensation circuit 18 is connected to the noninverting input terminal of the operational amplifier $A_6$ in the circuit $J_3$. In addition, the controlling transistor $Q_1$ in FIG. 11 is replaced by a JFET (junction field effect transistor) $Q_{11}$, analogous to FIG. 6, and a current controlling resistor $R_1$ is connected in series to the emitter of the driving transistor $Q_2$. Further, the bias current circuit 5 of FIG. 11 is replaced by a resistor $R_{12}$ as shown in FIG. 13.

Namely, in the temperature compensation circuit 18, there is connected a series circuit consisting of a transistor $Q_{12}$ and two resistors $R_{18}$ and $R_{19}$, between the ground and one power supply line 2b. The resistors $R_{18}$ and $R_{19}$ have identical temperature coefficient. The resistor $R_{20}$ is a resistor for setting base bias current for the transistor $Q_{12}$, and the base of the transistor $Q_{12}$ is connected to the power supply line 2b via a forwardly connected diode D and a reversely connected Zener diode ZD. The junction of the resistors $R_{18}$ and $R_{19}$ is connected to the noninverting input terminal of the operational amplifier $A_6$.

The diode D has a forward voltage which has the same value as the base-emitter voltage $V_{BE}$ of the transistor $Q_{12}$, and its temperature coefficient for voltage is also the same as that of the transistor $Q_{12}$.

Further, the Zener voltage $V_z$ of the Zener diode ZD has a temperature coefficient which has the opposite sign to the temperature coefficient of the light output $P_0$ of the laser diode LD. Moreover, choice is made of a Zener diode which has a coefficient that corresponds to the temperature coefficient of the light output $P_0$. As will be described later, the variable reference current source circuit $J_3$ utilizes the temperature coefficient of the Zener voltage $V_z$ of the Zener diode ZD to compensate the temperature coefficient of the light output $P_0$ of the laser diode LD.

Next, referring to FIGS. 12 (A) and 12 (B) and FIG. 24, the operation and the setting of the temperature coefficient of the reference current of the present embodiment will be described.

To begin, referring to FIGS. 12 (A) and 12 (B), the control of the light output when the laser diode LD and the Zener diode ZD are at constant temperature conditions of the room temperature will be described.

From FIG. 12 (A), it will be seen that the laser diode will realize a light output $P_0$ through the laser oscillation when its forward current $I_f$ reaches a certain "threshold current value" $I_{th}$, and thereafter the light output $P_0$ increases in proportion to the forward current $I_f$. On the other hand, the photodiode PD generates a photovoltaic current $I_s$ upon receipt of the light output $P_0$, in which the photovoltaic current $I_s$ increases, as shown in FIG. 12 (B), in proportion to the light output $P_0$.

Since the photovoltaic current $I_s$ that is detected in the photodiode PD is proportional to the light output $P_0$, the light output $P_0$ can be controlled to an output level that corresponds to the reference current $I_{ref}$, by feedback-controlling the light output $P_0$ so as to have a value that corresponds to the reference current $I_{ref}$.

Here, the value of the reference current $I_{ref}$ that is set in the variable reference current source circuit $J_3$ will be described. Since the forward voltage of the diode D and the base-emitter voltage $V_{BE}$ of the transistor $Q_{12}$ are arranged to have equal values, the voltage at the emitter of the transistor $Q_{12}$ has the same value as the Zener voltage $V_z$. Because of this, the controlling input voltage $V_c$ that is input to the noninverting input terminal of the operational amplifier $A_6$ will be given by $$V_c=V_z R_{19}/(R_{18}+R_{19}).$$

Next, at the emitter of the output transistor $Q_{10}$, a voltage which has the same value as the input voltage $V_c$ is generated, based on the principle of virtual short-circuiting of both input terminals of the operational amplifier $A_6$.

Therefore, by assuming the potential of the power supply line 2b to be that of the ground, the reference current $I_{ref}$ will be prescribed as follows.

$$I_{ref}=V_c/R_{17}=V_z R_{19}/[R_{17}(R_{18}+R_{19})] \quad (4)$$

Then, when the relation between the reference current $I_{ref}$ prescribed as above and the photovoltaic current $I_s$ detected by the photodiode PD satisfy the condition $I_s<I_{ref}$, the gate of the controlling transistor $Q_{11}$ is set at a voltage which is below the cut-off voltage so that the controlling transistor $Q_{11}$ will find itself in an off-state. Because of this, a bias current $I_b$ set by the resistor $R_{12}$ flows into the base of the driving transistor $Q_2$, bringing it to an on-state. As a result, in the laser diode LD there flows a maximum upper current as prescribed by the forward current circuit 4 to increase the light output $P_0$.

Along with an increase in the light output $P_0$, the photovoltaic current $I_s$ increases to satisfy the condition $I_s>I_{ref}$, the difference between the photovoltaic current $I_s$ and the reference current $I_{ref}$ flows into the transistor $Q_{10}$ of the variable reference current source circuit $J_3$ and to the resistor $R_{17}$, in an increasing manner. Then, the gate voltage of the transistor $Q_{11}$ is raised by the amount that corresponds to the difference current, and an amplified current that corresponds to the amount of increase in the gate voltage flows into the drain of the controlling transistor $Q_{11}$. Because of this, of the bias current $I_b$ that is prescribed by the bias setting resistor $R_{11}$, a current that corresponds to the amount of the amplified current flows to the side of the controlling transistor $Q_{11}$, and the base bias current of the driving transistor $Q_2$ is decreased by that amount. The driving transistor $Q_2$ is driven by the inverted and amplified current of the controlling transistor $Q_{11}$ so that its current amplification factor is reduced and the forward current $I_f$ of the laser diode LD is decreased.

When the temperature characteristics are not taken into consideration, by the feedback operation as in the above, the light output $P_0$ of the laser diode LD is controlled to an output level for which the photovoltaic current $I_s$ is a value that corresponds to the reference current $I_{ref}$.

Next, the setting of the temperature coefficient of the reference current $I_{ref}$ for compensating for the temperature coefficient of the light output $P_0$ of the laser diode will be described.

Figure 24:
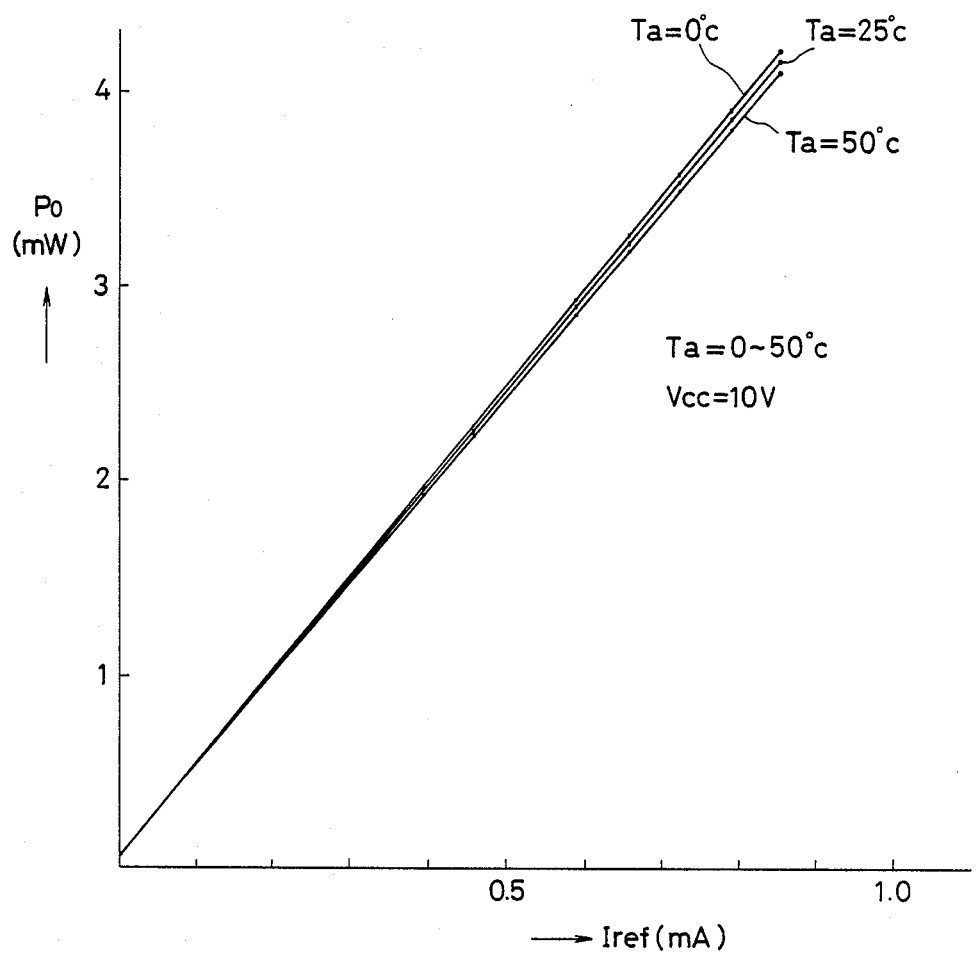
FIG. 24 is a characteristic diagram for showing the temperature characteristics of the light output from the laser diode used in FIG. 23.

FIG. 24 shows an example of measurements on the temperature characteristics of the light output $P_0$ for the laser diode LD, with the reference current $I_{ref}$ as the variable.

From the temperature characteristics, an experimental formula for the light output $P_0$, for the case when the temperature dependence is taken into consideration, will be represented by the following equation.

$$P_0 = \gamma_0(1 + \alpha \cdot \Delta T)I_{ref} + \beta \tag{5}$$

where
- $\gamma_0$ is the conversion factor (in the example shown in FIG. 24, it is 4.69 mW/mA),
- $\alpha$ is the temperature coefficient of $P_0$ (in the same example as in the above, it is $-496$ ppm/°C.),
- $\Delta T$ is the deviation from the room temperature (25° C.) (in °C.), and
- $\beta$ is a shift term that is generated due to a decrease in the conversion efficiency when the light output is small (in the same example as in the above, it is 0.07 mW).

Each of the above numerical examples represents the value that is obtained from the measured values when the ambient temperature is varied from 0° C. to 50° C.

As shown in the characteristics of FIG. 24, for a constant reference current Iref, the light output $P_0$ decreases with rise in the temperature. In other words, the light output $P_0$ has a negative temperature coefficient (for example, $\alpha = -496$ ppm/°C.).

Therefore, the compensation for the negative temperature coefficient $\alpha$ for the light output $P_0$ can be accomplished by giving the reference current $I_{ref}$ a temperature coefficient which has the opposite sign to, and a coefficient value that corresponds to, the temperature coefficient of the light output $P_0$.

Namely, the reference current $I_{ref}$ for the case when the temperature coefficient is taken into account is given by $$I_{ref} = I_{ref0}(1 + \alpha_i \Delta T), \tag{6}$$

where
- $I_{ref0}$ is the reference current at the room temperature (25° C.),
- $\alpha_i$ is the temperature coefficient for the reference current.

By substituting Eq. (6) into Eq. (5) one obtains $$P_0 = \gamma_0 \cdot I_{ref0}\{1 + (\alpha + \alpha_i) \cdot \Delta T + \alpha \cdot \alpha_i (\Delta T)^2\} + \beta \tag{7}$$

Here, if the temperature coefficient $\alpha_i$ of the reference current is set, as shown in Eq. (8) below, to be numerically equal and with opposite sign to the temperature coefficient of the conversion coefficient (temperature coefficient of the light output $P_0$), and $\alpha_i \cdot \alpha$ to be very small, namely, $$\alpha_i = -\alpha, \quad \alpha \cdot \alpha_i \ll 1 \tag{8}$$

then Eq. (7) may be represented as follows.

$$P_0 = \gamma_0 \cdot I_{ref0} + \beta \tag{9}$$

In other words, if the temperature coefficient of the reference current is set from Eq. (8) as $60_i = +496$ ppm/°C., the condition $\alpha \cdot \alpha_i \ll 1$ can be satisfied, and the light output $P_0$ will no longer have a temperature dependence as a result of compensation by the temperature coefficient of the reference current.

According to the present invention, as a means of giving a temperature coefficient, as represented by $\alpha_i$, to the reference current $I_{ref}$, a circuit is constructed by connecting a temperature compensating circuit 18 that includes a Zener diode ZD to the variable reference current source circuit, as in the above, and made use of the temperature coefficient $\alpha_z$ of the Zener voltage $V_z$ of the Zener diode ZD.

By choosing a Zener diode ZD which possesses a positive temperature coefficient for the temperature coefficient $\alpha_z$ of the Zener voltage $V_z$, it becomes possible to give a corresponding temperature coefficient to the reference current $I_{ref}$ also, as may be seen from Eq. (4).

From Eq. (4), the temperature coefficient $\alpha_z$ of the Zener voltage and the temperature coefficient $\alpha_i$ of the reference current are related by the following equation.

$$\alpha_i = \alpha_z \cdot R_{19}/(R_{18} + R_{19}). \tag{10}$$

Corresponding to the numerical values shown earlier, it becomes possible to adjust the temperature coefficient $\alpha_i$ of the reference current to satisfy Eq. (8), by choosing the temperature coefficient $\alpha_z$ of the Zener voltage of about $+600$ ppm/°C. and by appropriately adjusting the values of the resistances $R_{18}$ and $R_{19}$.

Figure 25:
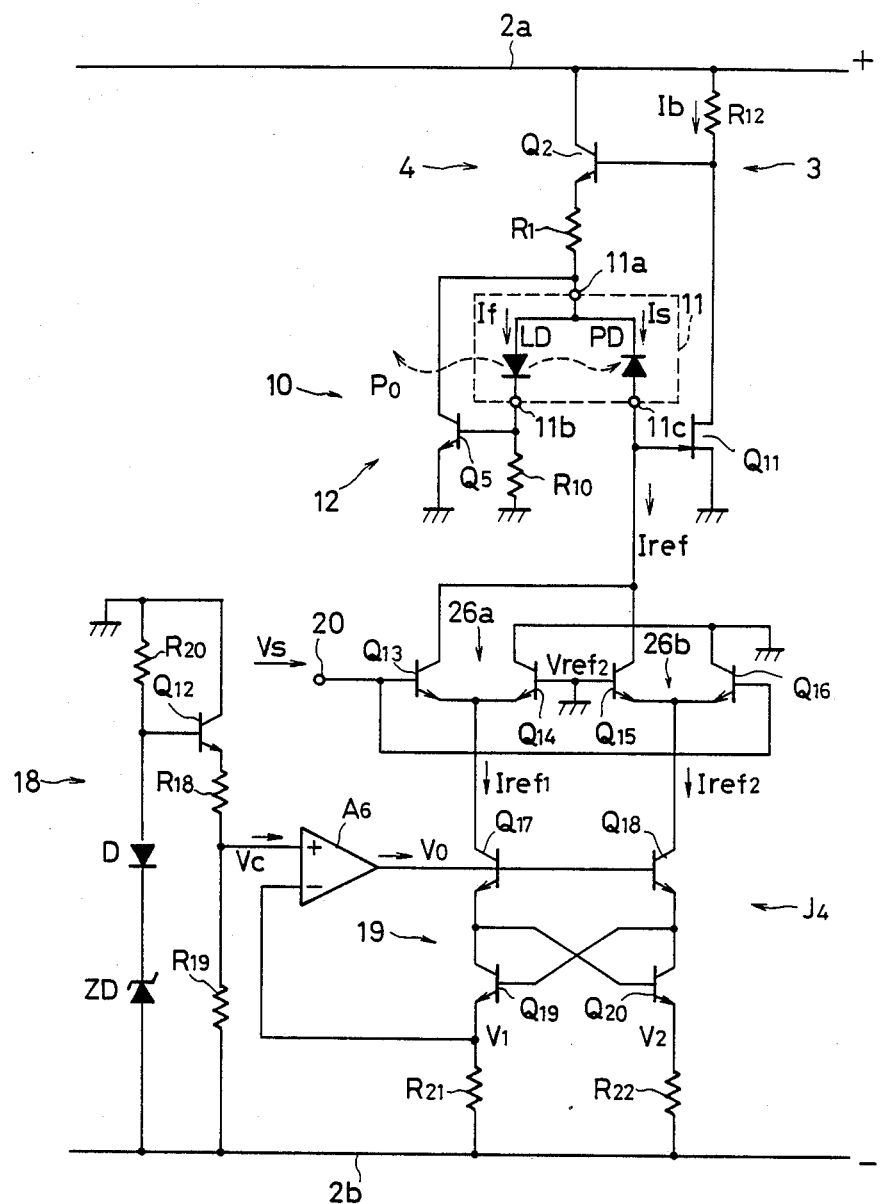
FIG. 25 is a circuit diagram for showing a modification to the fourth embodiment.

Next, in FIG. 25, there is shown a modification to the fourth embodiment. This modification is realized by making it possible to set the reference current $I_{ref}$ that is set in a reference current source circuit $J_4$ between two kinds of reference current values, namely, $I_{ref1}$ and $I_{ref2}$, by switching.

When applying the temperature compensation circuit for the light output of the laser diode to, for example, a laser light source of a laser diode, it is necessary to control the light output $P_0$ stably to the two state of different output values, namely, the read power and the write power of an optical disk drive. The present modification is an extremely preferred circuit for application to such a case.

Regarding the configuration of the modification, that the reference current source circuit $J_4$ has an operational amplifier $A_6$ and a temperature compensation circuit 18 that includes a Zener diode ZD on the input side of the operational amplifier $A_6$, is analogous to the circuit of FIG. 23. In this modification, the output side of the operational amplifier $A_6$ has the following configuration for setting the reference current $I_{ref}$ to the two values.

Namely, on the anode terminal 11c side of the photodiode PD there are connected a first and a second differential amplifiers 26a and 26b that consist of pairs of transistors $Q_{13}$, $Q_{14}$ and $Q_{15}$, $Q_{16}$, respectively, a cross-coupled circuit 19 consisting of four transistors $Q_{17}$ to $Q_{20}$, and resistors $R_{21}$ and $R_{22}$ for setting reference current that are connected respectively to the emitters of the transistors $Q_{19}$ and $Q_{20}$ of the cross-coupled circuit 19.

A first and a second differential amplifiers 26a and 26b constitute a selector switch for switching between the two kinds of value of the reference current $I_{ref}$. To the base of the transistor $Q_{13}$ in the first differential amplifier 26a and the base of the transistor $Q_{16}$ in the second differential circuit 26b there is applied a switch-controlling voltage $V_s$ from a control voltage input terminal 20. On the other hand, to the base of the transistor $Q_{14}$ in the first differential amplifier 26a and the base of the transistor $Q_{15}$ in the second differential amplifier 26b, there is applied a reference voltage $V_{ref2}$ (in the example shown in the figure, it is the ground potential).

When the relation between the switch-controlling voltage $V_s$ and the reference voltage $V_{ref2}$ satisfies $V_s > V_{ref2}$, the transistor $Q_{13}$ in the first differential amplifier 26a is shifted to on-state, and the anode terminal 11c of the photodiode PD is selected to the collector current $I_{ref1}$ of the transistor $Q_{17}$ in the cross-coupled circuit 19.

On the other hand, when $V_s < V_{ref2}$, the transistor $Q_{15}$ in the second differential amplifier 26b is shifted to on-state, and the anode terminal 11c of the photodiode PD is selected to the collector current $I_{ref2}$ of the transistor $Q_{18}$ in the cross-coupled circuit 19.

Now, the voltage $V_1$ at the junction between the transistor $Q_{19}$ and the resistor $R_{21}$ for setting the first reference current, and the voltage $V_2$ at the junction between the transistor $Q_{20}$ and the resistor $R_{22}$ for setting the second difference current, are both equal to the input voltage $V_c$ of the operational amplifier $A_6$. Therefore, the two kinds of reference current values $I_{ref1}$ and $I_{ref2}$ are prescribed nearly similar to Eq. (4) by the following equations.

$$I_{ref1} = V_z R_{19}/R_{21}(R_{18}+R_{19}), \quad (11)$$

$$I_{ref2} = V_z R_{19}/R_{22}(R_{18}+R_{19}), \quad (12)$$

The configuration other than the part of reference current source circuit J4, the operation of compensating for the temperature characteristics of the light output of the laser diode LD by the temperature characteristics of the first and the second reference currents $I_{ref1}$ and $I_{ref2}$ that are set, the fact that the temperature coefficients of the reference currents $I_{ref1}$ and $I_{ref2}$ are set to the desired values by means of the temperature coefficient of the Zener voltage $V_z$ of the Zener diode, and so on, are approximately the same as in the case of the fourth embodiment.

Therefore, according to the present modification, it is possible to control the light output of the laser diode to the two kinds of output levels very stably, without involving temperature dependence.

By applying this modification to an optical disk device, it is possible to simultaneously decrease temperature coefficients of read and write beams.

Figure 26:
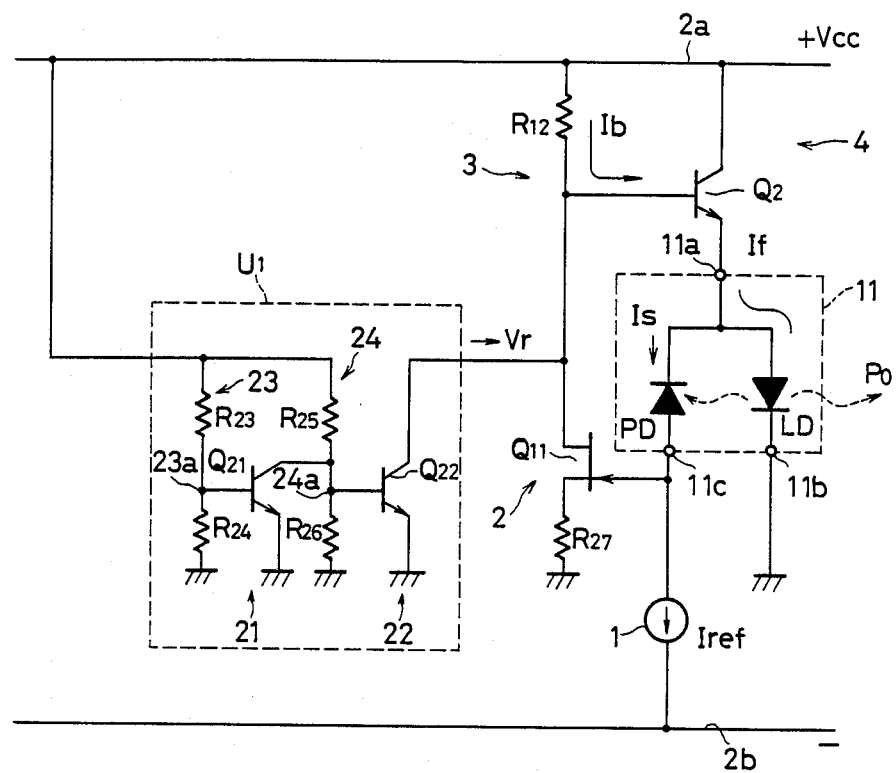
FIG. 26 is a circuit diagram for a fifth embodiment of the laser diode driving circuit that has a resetting circuit, of the present invention.

FIG. 26 is a diagram for showing the fifth embodiment of the present invention.

This embodiment is obtained by adding to the driving circuit for the laser diode LD that consists of the photodiode PD, a reference current source 1, an inverting and amplifying means 2 that has a junction field effect transistor (JFET) $Q_2$, a feedback circuit 3, and a forward current driver 4, a resetting circuit $U_1$ that consists of a detecting means 21 and a reset means 22. By this configuration, the power supply voltage $V_{cc}$ that is supplied by a positive power supply line 2a is monitored, and the driving circuit is reset so as to prevent the operation of the laser diode LD when the voltage $V_{cc}$ is lowered to a predetermined voltage value.

Now, the reference current source 1 that is provided in the driving circuit actually consists of a voltage current conversion circuit that is instrumented an operational amplifier. To the noninverting input terminal of the operational amplifier, there is applied a voltage which is obtained by driving the power supply voltage $+V_{cc}$ to an appropriate voltage value, as a voltage for setting reference current. On the output side of the operational amplifier, there is set a converted current that has a value that corresponds to the voltage for setting, as a reference current $I_{ref}$.

Further, the junction of the anode terminal 11c and the reference current source 1 is connected to the gate of a controlling transistor $Q_{11}$ that consists of a JFET. The symbol $R_{27}$ designates a source resistor, and the drain is connected to the base of the driving transistor $Q_2$.

When the power supply voltage $+V_{cc}$ is kept constant at a predetermined voltage value, the difference between the photovoltaic current $I_s$ of the photodiode PD that monitors the light output of the laser diode LD and the reference current $I_{ref}$ that is set to the reference current source 1, is inverted and amplified by the controlling transistor $Q_{11}$, and the inverted and amplified output is fed back via a forward current circuit 4 to a feedback circuit 3. By means of the feedback action, the forward current $I_f$ of the laser diode LD is controlled to a current value that corresponds to the reference current $I_{ref}$, and the light output $P_0$ of the laser diode LD is controlled so as to have a fixed value on the output level that corresponds to the set reference current $I_{ref}$.

Now, let the forward voltage, corresponding to the oscillating state of the laser diode when the forward current $I_f$ reached a threshold current value, be called $V_f$, and the base-emitter voltage of the driving transistor $Q_2$, $V_{BE}$. Next, the operation of the laser diode LD during increase in the power supply voltage $V_{cc}$ from 0V to a predetermined value as shown in FIG. 27, which occurs in such a case as, for example, during the on-state operation of the power supply will be considered.

Figure 27:
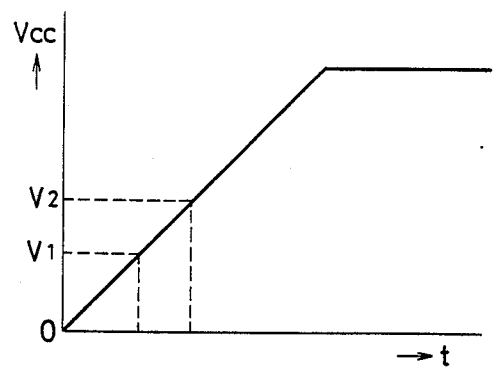
FIG. 27 is a characteristic diagram for showing the change in the power supply voltage to illustrate the operation of the resetting circuit used in FIG. 26.

When $V_1$ and $V_2$ in FIG. 27 are fixed to $$V_1 = V_f \text{ and } V_2 = V_f + V_{be},$$

respectively, for $V_{cc} < V_1$, the driving transistor $Q_2$ becomes off-state, so that the driving circuit becomes inactive state and the laser diode LD will not radiate. On the other hand, for $V_{cc} > V_2$, the driving transistor $Q_1$ is possible to become on-state. Therefore, if a desired reference current $I_{ref}$ is set correctly in the reference current source 1, the laser diode LD will generate a constant light output $P_0$ with an output level that corresponds to the reference current $I_{ref}$.

Further, when the power supply voltage has a value in between the above two, $V_1 < V_{cc} < V_2$, the driving transistor $Q_2$ is capable of being shifted to an on-state by being triggered by the bias current $I_b$, so that forward current $I_f$ with some magnitude flows in the laser diode LD.

On the other hand, the operational amplifier that sets the reference current $I_{ref}$ is desired to become inactive when the power supply voltage $V_{cc}$ is less than a predetermined voltage. However, an excess output voltage may sometimes be generated due to a malfunction caused by an inversion in the balancing of the input voltages to the inverting and noninverting input terminals.

In such a case, the reference current $I_{ref}$ is set at an abnormally high value, and an excess forward current $I_f$ flows in the laser diode LD based on this, generating an abnormally high light output $P_0$.

Figure 28:
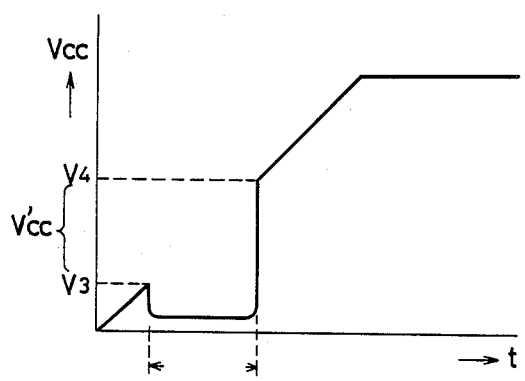
FIG. 28 is a characteristic diagram for showing an example of the range of the power supply voltage changes for which the resetting circuit is operative, FIGS. 29A and 29B give characteristic diagrams for showing respective examples of the range of the power supply voltage changes and the changes in the reset signal level, for which the circuit of FIG. 26 is operative.

However, when the laser diode LD is used, for instance, as the light source for an optical disc device, if such an abnormally high light output $P_0$ is generated, in a case such as the closing or opening of the power supply, under the generation of a state of low impressed voltage, then an erroneous writing or erasing of a signal for the recording medium will take place. The fifth embodiment shown in FIG. 26 is aimed at eliminating such a problem. In the embodiment, the laser diode LD is arranged to become inoperative in a state, such as the time of closing or opening of the power supply, when the power supply voltage is low, by means of the provision of a detecting means 21 which detects the drop of the power supply voltage $V_{cc}$ to a predetermined voltage value $V_{cc}'$ that is shown in FIG. 28, and a resetting means 2 consisting of a transistor $Q_{22}$ which is operated by the signal detected by the detecting means 21 to set the driving circuit to the nondriving condition.

In the above, the predetermined voltage source $V_{cc}'$ has a value which is prescribed by the following conditions.

$$V_3 < V_{cc}' < V_4,$$

$$V_3 < V_1, V_4 > V_2. \quad (13)$$

In FIG. 26, the detecting means 21 in the resetting circuit U1 of the present embodiment consists of two sets of voltage divider circuits, namely, a first voltage divider circuit 24 formed by two resistors $R_{25}$ and $R_{26}$ and a second voltage divider circuit 23 formed by two resistors $R_{23}$ and $R_{24}$, and one transistor $Q_{21}$.

Namely, the first and the second voltage divider circuits 24 and 23 are connected in parallel between the power supply line 2a and the ground, with the voltage dividing point 24a of the first voltage dividing circuit 24 connected to the base of the resetting transistor $Q_{22}$, and the voltage dividing point 23a of the second voltage divider circuit 23 connected to the base of the transistor $Q_{21}$. Further, the collector of the transistor $Q_{21}$ is connected to the base of the resetting transistor $Q_{22}$.

If the voltages between the base and the emitter of the transistors $Q_{22}$ and $Q_{21}$ are called $V_{BE22}$ and $V_{BE21}$, respectively, then the resistors in the voltage divider circuits 24 and 23 are prescribed to satisfy the following equations.

$$V_3 = V_{BE22} \cdot (R_{25} + R_{26})/R_{26},$$

$$V_4 = V_{BE21} \cdot (R_{23} + R_{24})/R_{24}. \quad (14)$$

Moreover, the resistors that appear between the first and the second voltage divider circuits 24 and 23 are prescribed as follows in order to satisfy Eq. (13).

$$R_{25}/R_{26} < R_{23}/R_{24}. \quad (15)$$

Figure 29A:
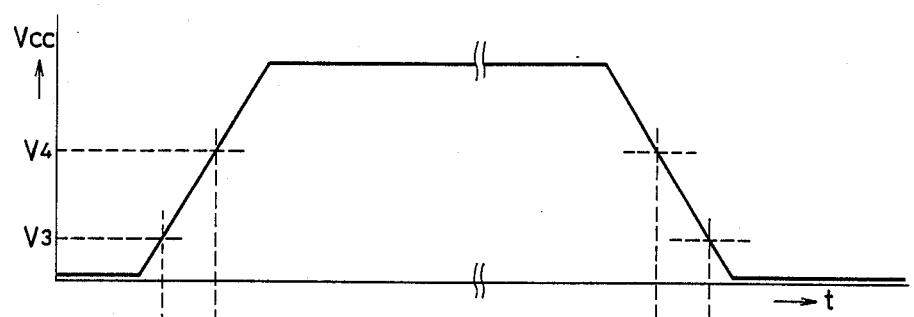
Figure 29B:
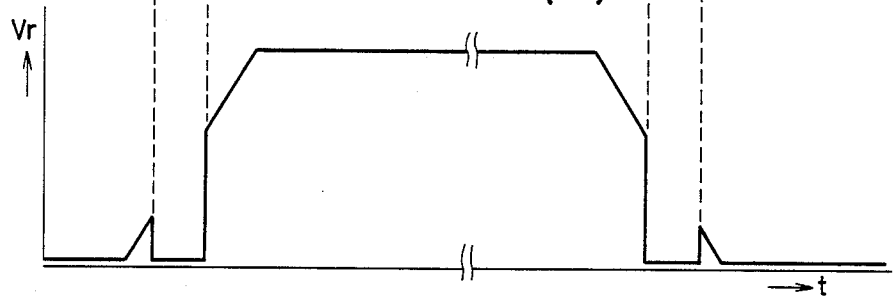

Referring to FIGS. 29 (A) and 29 (B), the operation of the present embodiment will be described next. FIG. 29 (A) shows the changes in the rise and the fall of the power supply voltage $V_{cc}$, and FIG. 29 (B) shows the changes in the reset signal $V_r$ that is output from the resetting circuit U1 during the rise or the fall of the power supply voltage $V_{cc}$.

First, when the power supply voltage $V_{cc}$ reaches a voltage $V_3$ in its rising, it is detected by the first voltage divider circuit 24, and the voltage $V_{BE22}$ is generated from voltage dividing point 24a. By the voltage $V_{BE22}$, the resetting transistor $Q_{22}$ is shifted to on-state, an L level reset signal $V_r$ is output from the resetting circuit U1, and the driving transistor $Q_2$ becomes off-state to set the driving circuit to the nondriving state.

When the voltage reaches $V_4$ with a rise in the power supply voltage $V_{cc}$, this is detected by the second circuit 23, and a voltage of $V_{BE21}$ is generated at the voltage dividing point 23a. The transistor $Q_{21}$ is shifted to on-state by the voltage $V_{BE21}$ which sets the resetting transistor $Q_{22}$ to off-state, and an H level reset signal $V_r$ is output from the resetting circuit U1.

By the H level reset signal $V_r$, the driving transistor $Q_2$ is shifted to on-state, and the driving circuit returns to the driving condition.

However, when the power supply voltage $V_{cc}$ becomes $V_{cc}'$, namely, $V_3 < V_{cc}' < V_4$, the reset signal $V_r$ becomes L level, and the driving circuit is set to the nondriving condition.

On the other hand, during the fall of the power supply voltage $V_{cc}$, the process is opposite to what has been described in the above. First, when the power supply voltage $V_{cc}$ drops to the voltage $V_4$, the transistor $Q_{21}$ is shifted to off-state, causing the resetting transistor $Q_{22}$ to become on-state, and the driving circuit is set to the nondriving condition due to the outputting of an L level reset signal $V_r$.

When the power supply voltage $V_{cc}$ drops further to the voltage $V_3$, the resetting transistor $Q_{22}$ is shifted to off-state, the reset signal $V_r$ becomes H level. In this state, no forward current is supplied from the driving circuit since the power supply voltage $V_{cc}$ is excessively low.

More specifically, by choosing the resistances in the first voltage divider circuit 24 as $R_{25} = 8.6$ k$\Omega$ and $R_{26} = 20$ k$\Omega$, the resistances in the second voltage divider circuit 23 as $R_{23} = 22$ k$\Omega$ and $R_{24} = 10$ k$\Omega$, $V_1 = 1.5$ V and $V_2 = 2.2$ V, and regulating $V_3$ and $V_4$ to $V_3 = 1$ V and $V_4 = 3$ V, it was found that the driving current can be reset in the prescribed range of the power supply voltage and that the malfunctions of the driving circuit can be prevented.

Figure 30:
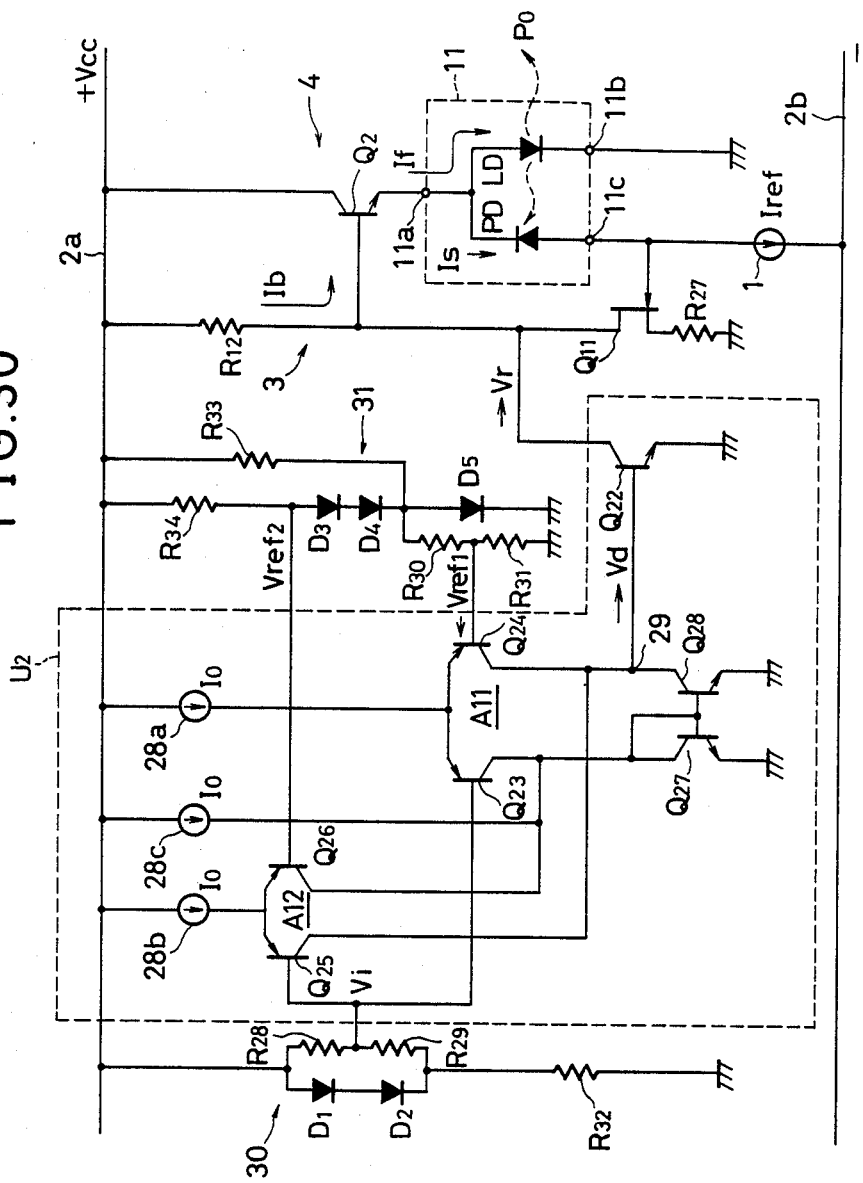
FIG. 30 is a circuit diagram for showing a first modification to the fifth embodiment.

FIG. 30 shows a first modification to the fifth embodiment. In this modification, use is made of a window comparator consisting of two differential amplifier circuits (operational amplifiers), namely, a first circuit $A_{11}$ and a second circuit $A_{12}$, as a detecting means in the resetting circuit U2.

The first differential amplifier circuit $A_{11}$ consists of a pair of transistors $Q_{23}$ and $Q_{24}$ that are biased by a constant current source 28a, and an active load that is formed by current mirror transistors $Q_{27}$ and $Q_{28}$.

The second differential amplifier circuit $A_{12}$ consists of a pair of transistors $Q_{25}$ and $Q_{26}$ that are biased by a constant current source 28b, with the current mirror transistors $Q_{27}$ and $Q_{28}$ as the common active load.

Reference numeral 28c is a biased constant current source for the current mirror transistors $Q_{27}$ and $Q_{28}$, and 29 is an output terminal for the window comparator.

Reference numeral 30 is a setting circuit for the input voltage $V_i$ for the window comparator, and is composed of two diodes $D_1$ and $D_2$ and three resistors $R_{28}$, $R_{29}$, and $R_{32}$. By calling the forward voltage for each of the diodes $D_1$ and $D_2$ as $V_{fd}$, the input voltage $V_i$ is set as in the following equation.

$$V_i = V_{cc} - 2V_{fd} \cdot R_{28}/(R_{28}+R_{29}) = V_{cc} - V_i'. \quad (16)$$

Further, reference numeral 31 is a circuit for setting the first and the second reference voltage $V_{ref1}$ and $V_{ref2}$ for the first and the second differential amplifiers $A_{11}$ and $A_{12}$, respectively, and is composed of three diodes $D_3$, $D_4$, and $D_5$ and four resistors $R_{34}$, $R_{33}$, $R_{30}$, and $R_{31}$. The first reference voltage $V_{ref1}$ is set corresponding to the power supply voltage $V_3$, and the second reference voltage $V_{ref2}$ is set corresponding to the power supply voltage $V_4$. That is, the first and the second reference voltages $V_{ref1}$ and $V_{ref2}$ are set to satisfy the following relations for the first and the second power supply voltages $V_3$ and $V_4$.

$$V_{ref1} = V_3 - V_i',$$

$$V_{ref2} = V_4 - V_i'. \quad (17)$$

FIG. 31 is a characteristic diagram which shows the relations represented by Eq. (17), namely, the relation between the power supply voltage $V_{cc}$ and the input voltage $V_i$.

The detecting means that consists of the window comparator outputs a detection signal $V_d$ of H level from the output terminal 29, when the input voltage $V_i$ satisfies $$V_{ref1} < V_i < V_{ref2},$$

that is, when the prescribed power supply voltage $V_{cc}'$ satisfies $$V_3 < V_{cc}' < V_4.$$

By the detection signal $V_d$ of H level, the resetting transistor $Q_{22}$ is shifted to on-state, the reset signal $V_r$ becomes L level, and the driving circuit is set to non-driving condition.

To give a concrete example, $V_i'$ in the input voltage setting circuit 30 was set, for example, to 1 V, and the first and the second reference voltages $V_{ref1}$ and $V_{ref2}$ were set to 0.5 V and 2.1 V, respectively. Accordingly, the driving circuit was set to be nondriving at a prescribed voltage value of the power supply voltage $V_{cc}$ in the range between $V_3 = 1.5$ V and $V_4 = 3.1$ V, as determined from Eq. (17), and the malfunctions of the driving circuit during the fall of the power supply voltage $V_{cc}$ was found to be prevented.

Figure 32:
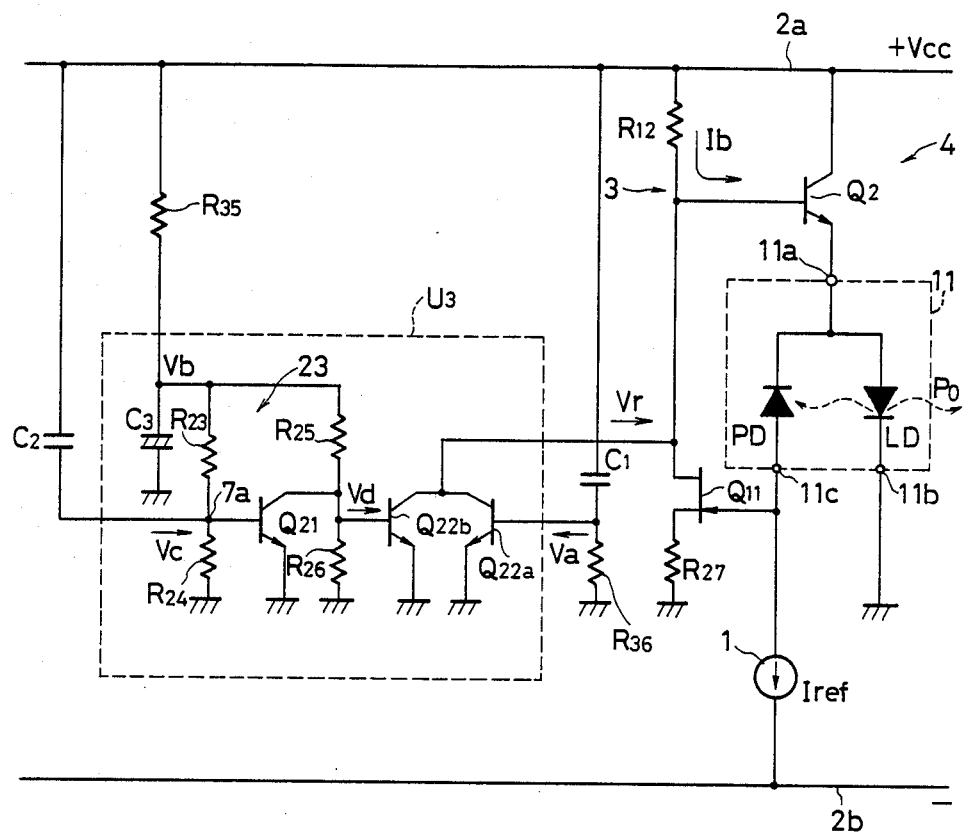
FIG. 32 is a circuit diagram for showing a second modification to the fifth embodiment, FIGS. 33A-33H give waveform diagrams that show the operation of various parts in the circuit of FIG. 32.

In FIG. 32, there is shown a second modification to the fifth embodiment. In this modification, there is included a time constant circuit that is needed, in the resetting circuit $U_3$. This is for making the resetting operation of the driving circuit to be securer by continuing the generation of the reset signal $V_r$ for a duration that is needed, when the power supply voltage $V_{cc}$ underwent a rapid change of rise or fall in the closing or opening of the power supply.

The resetting circuit $U_3$ in the modification has resetting transistors $Q_{22a}$ and $Q_{22b}$ that are arranged side by side, the collectors of the two resetting transistors $Q_{22a}$ and $Q_{22b}$ are jointly connected, and the common joining point is connected to the base of the driving transistor $Q_2$.

Except for that two of the resetting transistors $Q_{22a}$ and $Q_{22b}$ are arranged side by side and that a time constant circuit is provided, the configuration is substantially the same as for the fifth embodiment shown in FIG. 26.

First, a rise time constant circuit consisting of a capacitor $C_1$ and a resistor $R_{36}$ is connected between a positive power supply line $2a$ and the ground, and the output point for the rise time const signal $V_a$ is connected to the base of the resetting transistor $Q_{22a}$.

On the other hand, a capacitor $C_2$ that constitutes a fall time constant circuit is connected between the positive power supply line $2a$ and the voltage dividing point $23a$ of the second voltage divider circuit 23. The fall time constant circuit consists of the capacitor $C_2$ and two resistors $R_{23}$ and $R_{24}$. Further, during the fall, the power supply voltage $V_{cc}$ is shifted to off-state, and there will be no charge to actuate the fall time constant circuit. Therefore, a series circuit consisting of a resistor $R_{35}$ and a capacitor $C_3$ is connected between the positive power supply line $2a$ and the ground, as a charge holding circuit.

Referring to FIGS. 33 (A) to 33 (H), the operation of the modification will now be described. During the rise of the power supply voltage $V_{cc}$ (FIG. 33 (A)), the rise time constant signal $V_a$ is generated for a duration $t_1$ that is prescribed by the time constant $\tau_1 C_1 \cdot R_{36}$ of the rise time constant circuit (FIG. 33 (B)). Then, one of the resetting transistors, $Q_{22a}$, is shifted to on-state and an L level reset signal $V_r$ is output (FIGS. 33 (C) and 33 (H)). By the reset signal $V_r$, the driving circuit is reset for a duration of $t_1$, and the malfunction of the driving circuit in the rise of the power supply voltage $V_{cc}$ can be prevented.

On the other hand, during the supply of the prescribed power supply voltage $V_{cc}$, there is charged the power supply voltage $V_{cc}$ in the capacitor $C_3$ of the charge holding circuit, as shown in FIG. 33 (D).

Further, during the fall of the power supply voltage $V_{cc}$ (FIG. 33 (A)), there is generated a fall time constant signal $V_c$ for a duration of $t_2$ prescribed by the time constant $\tau_2 = C_2 \cdot (R_{23}//R_{24})$ of the fall time constant circuit (FIG. 33 (E)), shifting the transistor $Q_{21}$ to off-state. Then, the other resetting transistor $Q_{22b}$ becomes on-state (FIGS. 33 (F) and 33 (G)), an L level reset signal similar to that for the rise time is output (FIG. 33 (H)), and the malfunction of the driving circuit during the fall of the power supply voltage $V_{cc}$ can be prevented.

Figure 34:
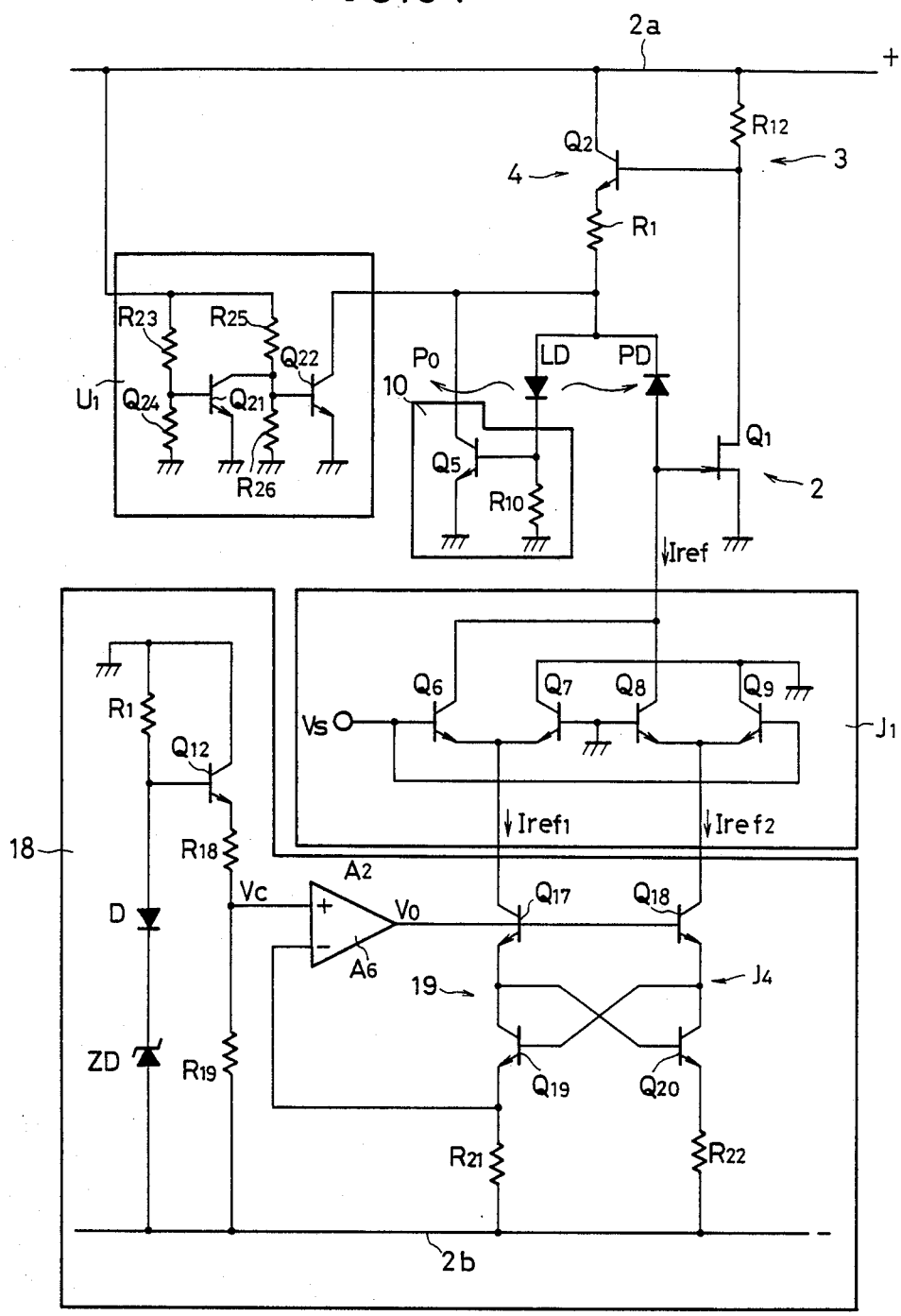
FIG. 34 is a circuit diagram for illustrating the overall configuration of a laser diode driving circuit that is a combination of the first to the fifth embodiments

FIG. 34 is a circuit diagram for showing the overall configuration constructed by connecting the peripheral circuits such as an excess current protective circuit 10, a reference current switching circuit $J_1$, a temperature compensation and a resetting circuit $U_1$, to a combination of the circuits for the first through the fifth embodiments, namely, the basic driving circuit consisting of the laser diode LD, the photodiode PD, a reference current source 1, an inverting and amplifying circuit 2, a feedback circuit 3, and a forward current circuit 4. With such a configuration, the laser diode driving circuit is possible to control the light output from the laser diode at a predetermined value tably and fast. In addition, it is possible to protect the laser diode against an excess current, temperature changes, and fall in the power supply voltage, and to variably modulate the light output of the laser diode to the predetermined values that correspond to a plurality of reference voltages.

What is claimed is:

1. A light emitting apparatus comprising:
   a semiconductor device for emitting a light in response to a driving current;
   means for outputting a photovoltia current having a value corresponding to the intensity of the light emitted from the semiconductor device;
   a current source electrically coupled to the outputting means, for supplying a reference current having a predetermined value to the outputting means; and
   means electrically coupled to the semiconductor device, for controlling the driving current and supplying the controlled driving current to the semiconductor device such that the photovoltaic current output from the outputting means changes in proportion to the reference current form the current source.

2. The light emitting apparatus as claimed in claim 1 wherein the current controlling means comprises a resistor.

3. The light emitting apparatus as claimed in claim 1 further comprising:
   a switching circuit that is connected to the semiconductor device for intermittently supplying the driving current to switch-control the semiconductor device.

4. The light emitting apparatus as claimed in claim 3, wherein the switching circuit comprises a switching transistor.

5. The light emitting apparatus as claimed in claim 1, further comprising:
   a capacitor connected in parallel to the controlling means for preventing oscillation thereof.

6. The light emitting apparatus as claimed in claim 1, wherein the voltage that is supplied to the controlling means is about +5 V.

7. The light emitting apparatus as claimed in claim 1, further comprising:
   current restricting means for detecting a forward current supplied to the semiconductor device and restricting the forward current supplied to the semiconductor device when the forward current detected by the detecting means exceeds a prescribed current value.

8. The light emitting apparatus as claimed in claim 7, wherein the detecting means comprises a detecting resistor that is connected in series to the semiconductor device.

9. The light emitting apparatus as claimed in claim 1, wherein said reference current source is constructed for generating a plurality of reference currents, and further comprising:
   a selecting means for selecting one of the plurality of reference currents form the reference current source.

10. The light emitting apparatus as claimed in claim 9, wherein the selecting means comprises a switching circuit connected between the reference current source and the controlling means.

11. The light emitting apparatus as claimed in claim 1, wherein the source, temperature coefficient from the reference current source has an opposite sign to a temperature coefficient of the light output and has the value that corresponds to the temperature coefficient of the light output.

12. The semiconductor device driving apparatus as claimed in claim 11, wherein the reference current source comprises a constant voltage diode that has a temperature coefficient which is opposite to the temperature coefficient of the light output and a reference signal formation circuit for generating a reference signal in response to the constant voltage from the constant voltage diode.

13. The light emitting apparatus as claimed in claim 2, further comprising:
   detecting means for detecting that the voltage of the controlling means is at least one of a prescribed voltage value so as to set the forward current circuit to a non-driving condition.

14. The light emitting apparatus as claimed in claim 13, wherein the prescribed voltage value is one between a first potential and a second potential.

15. The light emitting apparatus as claimed in claim 13, wherein the detecting means comprises of a first voltage dividing circuit formed by two resistors and a second voltage dividing circuit formed by two resistors, for dividing the power supply voltage, and a transistor connected between the first and the second voltage dividing circuits.

16. The light emitting apparatus as claimed in claim 1, wherein the current controlling means comprises a transistor.

17. The light emitting apparatus as claimed in claim 16, wherein the driving current is supplied from a collector of the transistor to the semiconductor device.

18. The light emitting apparatus as claimed in claimed in claim 16, wherein the driving current is supplied from an emitter of the transistor to the semiconductor device.

19. A light emitting apparatus comprising:
   a semiconductor device for emitting light in response to a driving current;
   means for outputting a photovoltaic current having a value corresponding to the intensity of the light emitted from the semiconductor device;
   a current source electrically coupled to the outputting means, for supplying a reference current having a predetermined value to the outputting means; and
   means electrically coupled to the semiconductor device, for controlling the driving current and supplying the controlled driving current to the semiconductor device so that the photovoltaic current output from the outputting means changes in proportion to the reference current from the current source, the current controlling means comprising a voltage comparator connected to the outputting means and the reference curren supplying means for inverting and amplifying the difference current between the photovoltaic current from the outputting means and the reference current from the current source, and feedback circuit connected to the voltage comparator and the semiconductor device for controlling the forward current to a current value that corresponds to the reference current, by feeding back the inverted and amplified output from the voltage comparator to the semiconductor device.

20. A light emitting apparatus comprising:
   a semiconductor device for emitting a light in response to a driving current;
   means electrically coupled to the semiconductor device, for supplying a driving current to the semiconductor device which emits a light corresponding to the supplied driving current;

means for generating a photovoltaic current in response to the intensity of the light emitted from the semiconductor device;

a current source electrically coupled to the generating means for outputting a reference current having a predetermined current value to the generating means; and means electrically coupled to the supplying means and the generating means, for controlling the supplying means such that the photovoltaic current output from the generating means changes in proportion to the reference current from the current source.

21. The light emitting apparatus as claimed in claim 20, wherein said controlling means comprises a resistor.

22. The light emitting apparatus as claimed in claim 20, further comprising:
a switching circuit that is connected to the semiconductor device for intermittently supplying the driving current to switching-control the semiconductor device.

23. The light emitting apparatus as claimed in claim 22, wherein the switching circuit comprises a switching transistor.

24. The light emitting apparatus as claimed in claim 20, further comprising:
a capacitor connected in parallel to the controlling means for preventing oscillation.

25. The light emitting apparatus as claimed in claim 20, wherein the voltage that is provided to the controlling means is about 30 5 V.

26. The light emitting apparatus as claimed in claim 20, wherein a temperature coefficient of the reference current from the current source has a sign which is opposite to that of the light output and has a value that corresponds to temperature coefficient of the light output.

27. The light emitting apparatus as claimed in claim 26, wherein the reference current source comprises a signal formation circuit for generating a reference signal in response to the constant voltage from a constant voltage diode which has a temperature coefficient which is opposite to the temperature coefficient of light output.

28. The light emitting apparatus as claimed in claim 20, further comprising:
detecting means for detecting that the voltage of the controlling means is at least one of a prescribed voltage value, in order to set the forward current circuit to a non-driving condition.

29. The light emitting apparatus as claimed in claim 28, wherein the prescribed voltage value is a value that lies between a first potential and a second potential.

30. The light emitting apparatus circuit as claimed in claim 28, wherein the detecting means comprises of a first voltage dividing circuit formed by two resistors and a second voltage dividing circuit formed by two resistors, for dividing the power supply voltage, and a transistor connected between the first and the second voltage dividing circuits.

31. The light emitting apparatus as claimed in claim 20, wherein the current controlling means comprises a transistor.

32. The light emitting apparatus as claimed in claim 30, wherein the supplying means is controlled by the collector of the transistor.

33. The light emitting apparatus as claimed in 31, wherein the driving current supply means comprises a resistor.

34. The light emitting apparatus as claimed in claim 20, wherein said drive current supplying means comprises a transistor.

35. A light emitting apparatus comprising:
a first semiconductor device for emitting light by supplying a driving currnet;
a first circuit having a first terminal connected to the first semiconductor device to supply the driving current to the first semiconductor device; and
a second circuit having a second terminal and a third terminal to receive a control current from a second semiconductor device for detecting light and to receive a reference current, respectively, the second circuit being connected to the first circuit to control the driving current to be supplied to the first terminal such that the control current changes in proportion to the reference current from the third terminal.

36. The light emitting apparatus as claimed in claim 35, wherein the first circuit further includes a current protective resistor connected in series with the first semiconductor device.

37. The light emitting apparatus as claimed in claim 35, wherein reference current supplied to the third terminal of the second circuit is from a current source.

38. The light emitting apparatus as claimed in claim 35, further comprising:
a switching transistor which is connected in parallel to the first semiconductor device for switching the first semiconductor device.

39. The light emitting apparatus as claimed in claim 35, further comprising:
a capacitor connected in parallel to the first circuit for preventing oscillation.

40. The light emitting apparatus as claimed in claim 35, wherein the voltage that is supplied to the first circuit or second circuit is about +5 V.

41. The light emitting apparatus as claimed in claim 35, further comprising:
detecting means for detecting a forward current supplied to the and for restricting the forward current supplied to the first semiconductor device when the forward current detected by the detecting means exceeds a prescribed current value.

42. The light emitting apparatus as claimed in claim 41, wherein the detecting means comprisesa detecting resistor that is connected in series to the first semiconductor device.

43. The light emitting apparatus as claimed in claim 35, wherein the second circuit has a reference current source, and a temperature coefficient of the reference current has a sign which is opposite to a temperature coefficient of the light output and has a value that corresponds to the temperature coefficient of the light output.

44. The light emitting apparatus as claimed in claim 43, wherein the reference signal source comprises a constant voltage diode that has a temperature coefficient which is opposite to the temperature coefficient of the light output and a reference signal formation circuit for generating a reference signal in response to the constant voltage from the constant voltage diode.

45. The light emitting apparatus as claimed in claim 35, further comprising:

detecting means for detecting that the voltage of the controlling means is at least one of a prescribed voltage value so as to set the forward current circuit to a non-driving condition.

46. The light emitted apparatus as claimed in claim 45, wherein the prescribed voltage value is a value that lies between a first potential and a second potential.

47. The light-emitting apparatus as claimed in claim 45, wherein the detecting means comprises of a first voltage dividing circuit formed by two resistors and a second voltage dividing circuit formed by two resistors, for dividing the power supply voltage, and a transistor connected between the first and the second voltage dividing circuits.

48. The light emitting apparatus as claimed in claim 35, wherein the second circuit comprises a transistor.

49. The first light emitting apparatus as claimed in claim 35, wherein the driving current, is supplied from the collector of the transistor to the first semiconductor device.

50. The first-emitting apparatus as claimed in claimed in claim 35, wherein the first circuit comprises a transistor.

51. A light emitting apparatus comprising:
a semiconductor device which emits a light by supplying a driving current;
means for outputting a photovoltaic current having a value corresponding to the intensity of the light emitted from the semiconductor device;
a voltage source electrically coupled to the outputting means, for supplying a reference voltage having a predetermined value to the outputting means;
means electrically coupled to the supplying means, for comparing the reference voltage supplied from the voltage source with a voltage having a value in accordance with the photovoltaic current output from the outputting means, to generate a control signal corresponding to the comparison; and
means electrically coupled to the comparing means, for controlling the semiconductor device in response to the control signal generated from the comparing means.

52. The light emitting apparatus as claimed in claim 51, wherein the semiconductor device controlling means comprises a current protective resistor which is connected in series to the semiconductor device.

53. The light emitting apparatus as claimed in claim 51, further comprising:
a capacitor connected in parallel to the controlling means for preventing oscillation.

54. The light emitting apparatus as claimed in claim 1, wherein the semiconductor device comprises a laser diode and the outputting means comprises a photodiode.

55. The light emitting apparatus as claimed in claim 54, wherein a cathode of the laser diode is connected to a cathode of the photodiode.

56. The light emitting apparatus as claimed in claim 54, wherein a cathode of the laser diode is connected to a cathode of the photodiode.

57. The light emitting apparatus as claimed in claim 20, wherein the semiconductor device comprises a laser diode and the outputting means comprises a photodiode.

58. The light emitting apparatus as claimed in claim 57, wherein an anode of the laser diode is connected to a cathode of the photodiode.

59. The light emitting apparatus as claimed in claim 57, wherein a cathode of the laser diode is connected to a cathode of the photodiode.

60. The light emitting apparatus as claimed in claim 51, wherein the semiconductor device comprises a laser diode and the outputting means comprises a photodiode.

61. The light emitting apparatus as claimed in claim 60, wherein an anode of the laser diode is connected to a cathode of the photodiode.

62. The light emitting apparatus as claimed in claim 60, wherein a cathode of the laser diode is connected to a cathode of the photodiode.

* * * * *